United States Patent
Saeki

(10) Patent No.: US 6,340,910 B1
(45) Date of Patent: Jan. 22, 2002

(54) CLOCK SIGNAL CONTROL METHOD AND CIRCUIT AND DATA TRANSMITTING APPARATUS EMPLOYING THE SAME

(75) Inventor: Takanori Saeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/603,211

(22) Filed: Jun. 26, 2000

(30) Foreign Application Priority Data

Jun. 24, 1999 (JP) ............................................. 11-178382

(51) Int. Cl.[7] .............................. G06F 1/04; H03K 3/00
(52) U.S. Cl. ...................................................... 327/296
(58) Field of Search ................................. 327/141, 144, 327/150, 152, 163, 291–293, 295, 296, 233, 257, 258

(56) References Cited

U.S. PATENT DOCUMENTS 5,612,640 A * 3/1997 Murabayashi et al. ...... 327/141
5,923,613 A * 7/1999 Tien et al. .................. 365/233
6,097,234 A * 8/2000 Yeo ............................ 327/295

FOREIGN PATENT DOCUMENTS

JP          10-190642          7/1998

OTHER PUBLICATIONS

Fleder, et al, "A 1.0625 Gb/s Transceiver with 2X oversampling and Transmit Signal Pre-Emphasis" in ISSCC (International Solid–State Circuits Conference), 1997; pp. 238 and 239.

* cited by examiner

Primary Examiner—My-Trang Nu Ton
(74) Attorney, Agent, or Firm—Hutchins, Wheeler & Dittmar

(57) ABSTRACT

A control circuit for clock signals which enables phase errors of respective clock signals to be averaged out as the phase difference between clock signals is kept. Multi-phase clock signals are interacted to average out respective phase error components between respective phases. To this end, plural stages of the averaging circuits for averaging out errors of respective phases are provided and clock signals are passed through the averaging circuits to effect averaging progressively to average out the phase errors for the entire clock signals.

20 Claims, 26 Drawing Sheets

CLOCK SIGNAL CONTROL METHOD AND CIRCUIT AND DATA TRANSMITTING APPARATUS EMPLOYING THE SAME

FIELD OF THE INVENTION

This invention relates to a clock signal control circuit, a clock signal control method and a data transmission apparatus employing the control circuit and method. More Particularly, it relates to a phase error averaging circuit for pulse signals suited for clock control of an interface used in high-speed communication and to a data transmission apparatus employing the phase error averaging circuit.

BACKGROUND OF THE INVENTION

Up to now, distribution of multi-phase clocks of two or more phases is by relaying and amplifying respective phase components by a circuit arrangement shown in FIG. 17a. Although not shown, complementary signals (two-phase signals) are occasionally distributed by a relay circuit adapted to cause interaction between the complementary signals. However, the clocks that can be handled by this known device are of two phases at most. Thus, should phase errors td occur as in input signals $P_0$ to $P_7$ as may be seen in the timing chart of FIG. 17b, an input clock is amplified with a phase error, as in the cases of $Q_2$, or a new phase error is added to the clock, as in the case of $Q_5$.

FIG. 18 shows an example of a digital PLL circuit for generating multi-phase or multiplied clocks. In this prior-art example, first to fourth delay circuits 901 to 904 are connected in series by first to fourth switches 905 to 908. After inputting the first clock 911, second to fifth clocks 912 to 915 are output. The fifth clock 915 is compared to the first clock 911 by a phase comparator 909. Based on an UP signal 916 or a DOWN signal 917, produced by a phase difference, a counter 910 outputs a control signal 918, which then controls the first to fourth switches 905 to 908 so that the first clock 911 and the fifth clock 915 will be close in phase to each other. This generates first to fourth clocks which are equally spaced apart four-phase clocks. In the case of multiplied clocks, the multiplied clocks are generated using these multi-phase clocks.

Although not shown in the drawings, such a system is also known in which plural delay circuits are arrayed in a ring and control is made of the number of ring steps and the number of cycling times. In this digital PLL circuit, phase errors of the multi-phase clocks produced by quantization errors of the control delay units as well as changes in the period of the multiplied clocks caused by phase errors of the multi-phase clocks are distributed straightly.

Thus, in distributing the multi-phase clocks, since there lacks the interaction between relay amplification circuits for the respective clocks, an increasing distance of distribution of the multi-phase clock signals due to the increased number of the relay amplification circuits leads to gradual increase in the error between the phases due to variations in the delay time of each relay amplification circuit, as a result of which the distributed distance of the multi-phase clocks is limited to the range of allowance of the phase errors.

FIG. 19 shows an example of application of actually distributing the multi-phase clocks. A reception circuit 1001 of FIG. 19 is such a circuit in which, for producing recovery clocks 1005 synchronized with bits of reception data 1002 as disclosed in JP Patent Kokai JP-10-190642A, a clock selection circuit 1003 selects multi-phase clocks $P_O$ to $P_n$, using transition points of the reception data 1001, and produces latch data 1006 using recovery clocks 1005. It is noted that the number of phases of the clocks is arbitrary and n is an integer. This reception circuit usually resides in the combination of a PLL (phase-locked loop) for generating multi-phase clocks $P_O$ to $P_n$ and a plurality of reception circuits 1009-O to 1009-m, as shown in FIG. 20. In this case, the multi-phase clocks $P_O$ to $P_n$ need to be routed through the reception circuits 1009-O to 1009-m. In addition, during such routing, the phase-to-phase phase difference of the multi-phase clocks needs to be kept.

FIGS. 21 and 22 show an arrangement in which reception data are captured by respective latch circuits with respective phases of the multi-phase clocks and processed in the LSI as parallel data. For outputting, the parallel data are again sequentially output as serial data.

This circuit system is disclosed in "A 1.0625 Gb/s Transceiver with 2X oversampling and Transmit Signal Pre-Emphasis" in ISSCC (International Solid-State Circuits Conference), 1997, pages 238 to 239. In the present system, eight-phase clocks $P_0$ to $P_7$ as multi-phase clocks are generated in the PLL 1102 on the receiving side, from reference clocks 1101, as shown in the block diagrams of FIG. 21 (a) and in a timing chart of FIG. 21 (b). Although the eight-phase clocks are used here, the number of phases may be changed depending on the overall circuit structure. The generated eight-phase clocks are routed to a reception circuit 1003 where input data are latched through a phase adjustment circuit 1104 by respective F/F (flip-flops). Since the frequency rate of input data is four times the frequency of each of the eight-phase clocks, the respective phases latch different values depending on changes in data. A phase comparator 1105 detects the data phase from changing points of the latched data to output a control signal 1106 which then is used in a Phase adjustment circuit 1104 so that the edges of the multi-phase clocks will be coincident with those of the data. Since one-half of data latched with the eight-phase clocks is used for detecting an optional phase change point, data detected at four phases, corresponding to every second phases, are output as parallel data.

As may be seen from the timing chart, if the input data assumes values of from $D_0$ to $D_7$ per period, the input data are serial/parallel converted every four bits. Also, as may be seen from the block diagram of FIG. 22 (a) and the timing chart of FIG. 22 (b), four-phase clocks of from $P_0$ to $P_3$, as multi-phase clocks, are generated on the transmitting side at the PLL 1202 from the reference clocks 1201. The generated four-phase clocks are routed to a transmission circuit 1203 where four parallel data are sequentially output as serial data by four parallel gates adapted to be turned on every one-fourth period.

It is seen from the timing chart that the four parallel data $DQ_0$ to $DQ_7$ are converted into output serial data $DS_0$ to $DS_7$.

In this system, since the phase components of the multi-phase clocks provide data period components, extremely stringent constraint is placed on the phase-interval errors. So, the transmission circuits and the multi-phase clock generating circuits are used frequently at a ratio of 1:1, that is one transmission circuit is used for one multi-phase clock generating circuit.

SUMMARY OF THE DISCLOSURE

It is an object of the present invention to overcome the deficiencies of the above-mentioned prior art and to provide a novel clock signal control circuit in which it is possible to average phase errors of the respective clock signals as the phase difference between clock signals is maintained. It is another object of the present invention to provide a data transmission apparatus employing this clock signal control circuit.

For accomplishing the above objects, the present invention provides a technical configuration which is basically as defined hereinbelow.

The present invention provides a clock signal control circuit, as its first aspect, wherein multi-phase clock signals are caused to interact to average out respective phase error components of the clock signals as the phases of the respective clock signals are kept.

The present invention provides a clock signal control circuit, as its second aspect comprising a plurality of averaging circuits. Each of averaging circuits causes multi-phase clock signals to interact to average out respective phase error components of the clock signals as the phases of the respective clock signals are kept. The averaging circuits are grouped into a plurality of sets of averaging circuits, wherein each of the averaging circuit sets effects averaging in different states from one another.

The present invention provides a clock signal control circuit, as its third aspect, in which phase errors of n pulses having different phase errors are averaged out to produce n pulses having averaged phase errors, wherein two or more gates arranged in parallel are provided and outputs of the gates are interconnected to form a unit averaging circuit for averaging phase errors of two or more pulses input to the gates, n of the unit averaging circuits are provided to constitute an averaging circuit set for averaging phase errors of the n pulses, and wherein $\log_2 n$ stages of the averaging circuit sets are provided, there being a phase inverting circuit provided at an input of each averaging circuit of a first one of the averaging circuit sets fed with the n pulses.

The present invention provides the clock signal control circuit, as its fourth aspect, wherein the n pulses are supplied to two different unit averaging circuits of the first averaging circuit set, and wherein outputs of the unit averaging circuits of the first averaging circuit set are each fed to two different unit averaging circuits of a second averaging circuit set provided downstream of the first averaging circuit set.

The present invention provides a clock signal control circuit, as its fifth aspect, wherein outputs of respective unit averaging circuits of the averaging circuit set of a previous stage are fed to two different unit averaging circuits of the averaging circuit set provided downstream of the averaging circuit set of the previous stage.

The present invention provides a clock signal control circuit, as its sixth aspect, wherein, in each of the unit averaging circuits of at least one averaging circuit set in the plural averaging circuit sets, signals differing in phase by $\pi/2^k$ radians, where k=0,1,2, ... are averaged out.

The present invention provides a clock signal control circuit, as its seventh aspect, wherein values of the k in the respective averaging circuit sets are different from one averaging circuit set to another.

The present invention provides a clock signal control circuit, as its eighth aspect, wherein, in the respective unit averaging circuits of at least one of the averaging circuit sets, signals with phases differing by $\pi$ radians are averaged out.

The present invention provides a clock signal control circuit, as its ninth aspect, wherein each unit averaging circuit of at least one of the averaging circuit sets averages out signals having phases different by $\pi/2$ radians from one another.

The present invention provides a clock signal control circuit, as its tenth aspect, wherein each unit averaging circuit of at least one of the averaging circuit sets averages out signals having phases neighboring (adjacent) to one another.

The present invention provides a clock signal control circuit, as its eleventh aspect, in which phase errors of n pulses having different phase errors are averaged out to produce n pulses having averaged phase errors, wherein a unit averaging circuit is formed which comprises a first differential pair, a load of each transistor of the first differential pair and a second differential pair connected in parallel with the first differential pair, each of the first and second differential pairs being fed with pulse signals having phases different from each other by $\pi$ radians to average out the phase errors of four impulses input to the first and second differential pairs, n/2 of the unit averaging circuits being provided to constitute an averaging circuit set for averaging out the phase errors of the n pulses, and wherein there are provided $\log_2 (n/2)$ stages of the averaging circuit sets.

The present invention provides a clock signal control circuit, as its twelfth aspect, wherein the n pulses are fed to two different unit averaging circuits of a first one of the unit averaging circuits, and wherein outputs of respective unit averaging circuits of the first averaging circuit set are each fed to two different unit averaging circuits of a second one of the unit averaging circuits provided downstream of the first averaging circuit set.

The present invention provides a clock signal control circuit, as its thirteenth aspect, wherein outputs of respective unit averaging circuits of the upstream side averaging circuit set are each fed to different two of the unit averaging circuits provided downstream of the upstream side averaging circuit sets.

The present invention provides a clock signal control circuit, as its fourteenth aspect, in which phase errors of n pulses having different phase errors are averaged out to produce n pulses having averaged phase errors, wherein a plurality of gates connected in parallel with one another are provided, outputs of the plural gates are interconnected to constitute a first unit averaging circuit adapted for averaging out phase errors of two or more pulses input to the gates, and a plurality of such first unit averaging circuits are provided to constitute a first averaging circuit set, and wherein a second unit averaging circuit is formed which comprises a first differential pair, a load of each transistor of the first differential pair and a second differential pair connected in parallel with the first differential pair, each of the first and second differential pairs being fed with pulse signals having phases different from each other by $\pi$ radians to average out the phase errors of four pulses fed to the first and second differential pairs, there being provided n/2 second unit averaging circuits to constitute a second averaging circuit set. The respective outputs of the unit averaging circuits of the first averaging circuit set are fed to the unit averaging circuit of the second averaging circuit set.

The present invention provides a clock signal control circuit, as its fifteenth aspect, in which Phase errors of n pulses having different phase errors are averaged out to produce n pulses having averaged phase errors, wherein a first unit averaging circuit is formed which comprises a first differential pair, a load of each transistor of the first differential pair and a second differential pair connected in parallel with the first differential pair, each of the first and second differential pairs being fed with pulse signals having phases different from each other by $\pi$ radians to average out the phase errors of four impulses fed to the first and second differential pairs, n/2 of the unit averaging circuits being provided to constitute an averaging circuit set for averaging out the phase errors of four pulses fed to the first and second differential pairs to constitute a first averaging circuit set;

a second unit averaging circuit is formed which comprises a plurality of gates arranged in parallel with one another, outputs of the plural gates being interconnected to average out phase errors of two or more pulses fed to the gates, a plurality of the second unit averaging circuits being provided to constitute a second averaging circuit set, respective outputs of the unit averaging circuits of the first averaging circuit set being adapted to be fed to the unit averaging circuits of the second averaging circuit set.

The present invention also provides a data transmission apparatus, in its first aspect, wherein multi-phase clocks generated in a multi-phase generating circuit are fed to a first device having phase error averaging circuit to average out phase errors of the multi-phase clocks as respective phases of the multi-phase clocks are kept, and wherein output of the phase error averaging circuit of the first device is fed to a second device having another phase error averaging circuit for averaging out phase errors of the multi-phase clocks under the condition that respective Phases of the multi-phase clocks fed to the second device are kept.

The present invention also provides a data transmission apparatus, in its second aspect, wherein multi-phase clocks generated in a multi-phase generating circuit are fed to a first device having phase error averaging circuit to average out phase errors of the multi-phase clocks as respective phases of the multi-phase clocks are kept, and wherein multi-phase clocks generated in the multi-phase generating circuit are fed to a second device having another phase error averaging circuit to average out phase errors of the multi-phase clocks under the condition that respective phases of the multi-phase clocks are kept.

The present invention provides a data transmission apparatus, in its third aspect, wherein the phase error averaging circuit is provided in a transmission device of a data transmission apparatus.

The present invention provides a data transmission apparatus, in its fourth aspect, wherein the phase error averaging circuit is provided in a reception device of a data transmission apparatus.

According to a further aspect of the present invention, there is provided a method for controlling clock signals. The method comprises: providing multi-phase clock signals having phase errors, and causing the multi-phase clock signals to interact with one another to average out phase error components of the lock signals, with the phases of the clock signals being kept.

Further aspects of the method will be apparent from the description of the foregoing aspects and the entire disclosure including the embodiments, claims and the drawings.

PREFERRED EMBODIMENTS OF THE INVENTION

Figure 1:
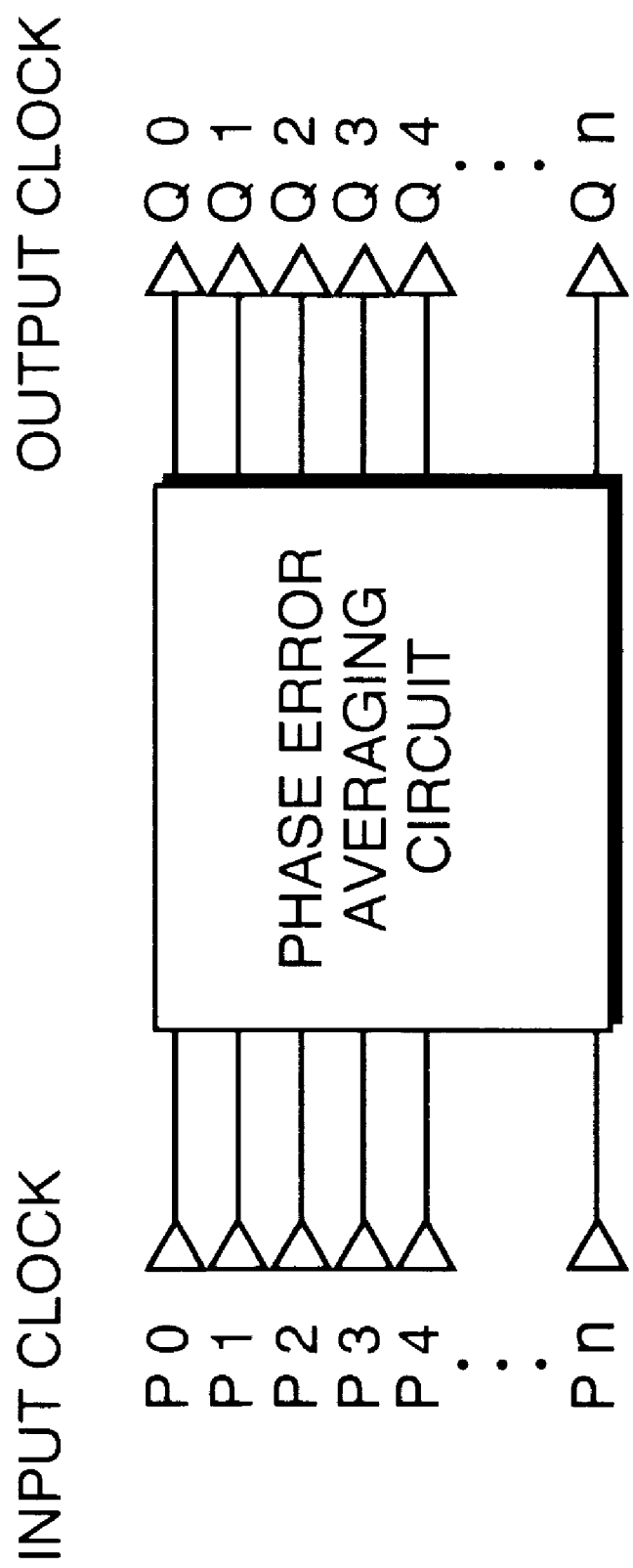
FIG. 1 is a block diagram showing a phase error averaging circuit according to the present invention.

In a phase error averaging circuit, as a clock signal control circuit according to the present invention, signal paths of n multi-phase clock signals $P_O$ to $P_n$, having different phase differences, are arranged in parallel, the respective signals are input to a phase error averaging circuit which then averages out phase errors of the respective clock signals to output resulting multi-phase clock signals $Q_0$ to $Q_n$.

EXAMPLES

Referring to the drawings, specified preferred embodiments of the clock signal control circuit and method and a data transmitting apparatus employing the circuit and the method, according to the present invention, will be explained in detail First Specified Example FIGS. 1 to 7 show a first specified example of a phase error averaging circuit as a clock signal control circuit according to the present invention. In these figures, there are shown a clock signal control circuit wherein multi-phase clock signals are caused to interact to average out respective phase error components of said clock signals as the phases of the respective clock signals are kept.

There is also shown therein a pulse signal phase error averaging circuit wherein an averaging circuit, in which multi-phase clock signals are caused to interact to average out respective phase error components of the clock signals as the phases of the respective clock signals are kept, is divided into a plurality of sets of averaging circuits, and wherein each of the averaging circuit sets effects averaging in different states (or modes).

There is also shown a pulse signal phase error averaging circuit in which phase errors of n pulses having different phase errors are averaged out to produce n pulses having averaged phase errors, wherein two or more gates 201a, 201b arranged in parallel are provided and outputs of the gates are interconnected to form a unit averaging circuit 201 for averaging phase errors of two or more pulses input to the gates, n of the unit averaging circuits are provided to constitute an averaging circuit set, for averaging phase errors of the n pulses, $\log_2 n$ stages of the averaging circuit sets are provided, there being a phase inverting circuit provided at an input of each averaging circuit of a first one of the averaging circuit 10 sets fed with the n pulses.

There is also shown a pulse signal phase error averaging circuit wherein the n pulses are entered to two different unit averaging circuits of the first averaging circuit set 10; and wherein outputs of the unit averaging circuits of the first averaging circuit set 10 are fed to two different unit averaging circuits of a second averaging circuit set 20 provided downstream of the first averaging circuit set 10.

There is also shown a pulse signal phase error averaging circuit wherein outputs of respective unit averaging circuits of the averaging circuit set 10 of a previous stage (upstream) are fed to two different unit averaging circuits of the averaging circuit set 20 provided downstream of the averaging circuit set 10 of the previous stage.

There is also shown a pulse signal phase error averaging circuit wherein, in each of the unit averaging circuits of at least one averaging circuit set in the plural averaging circuit sets, signals differing in phase by $\pi/2^k$ radians, where k=0,1,2, ... are averaged out.

There is also shown a pulse signal phase error averaging circuit wherein the values of the k in the respective averaging circuit sets are different from one averaging circuit set to another.

There is also shown a pulse signal phase error averaging circuit wherein, in the respective unit averaging circuits of at least one of the averaging circuit sets, signals with phases differing by $\pi$ radian are averaged out.

There is also shown a pulse signal phase error averaging circuit wherein each unit averaging circuit of at least one of the averaging circuit sets averages out signals having phases different by $\pi/2$ radian from one another.

There is also shown a pulse signal phase error averaging circuit wherein each unit averaging circuit of at least one of the averaging circuit sets averages out signals having phases adjacent to one another.

The present invention will be explained further in detail.

First, an averaging circuit for averaging two signals will be explained.

Figure 2:
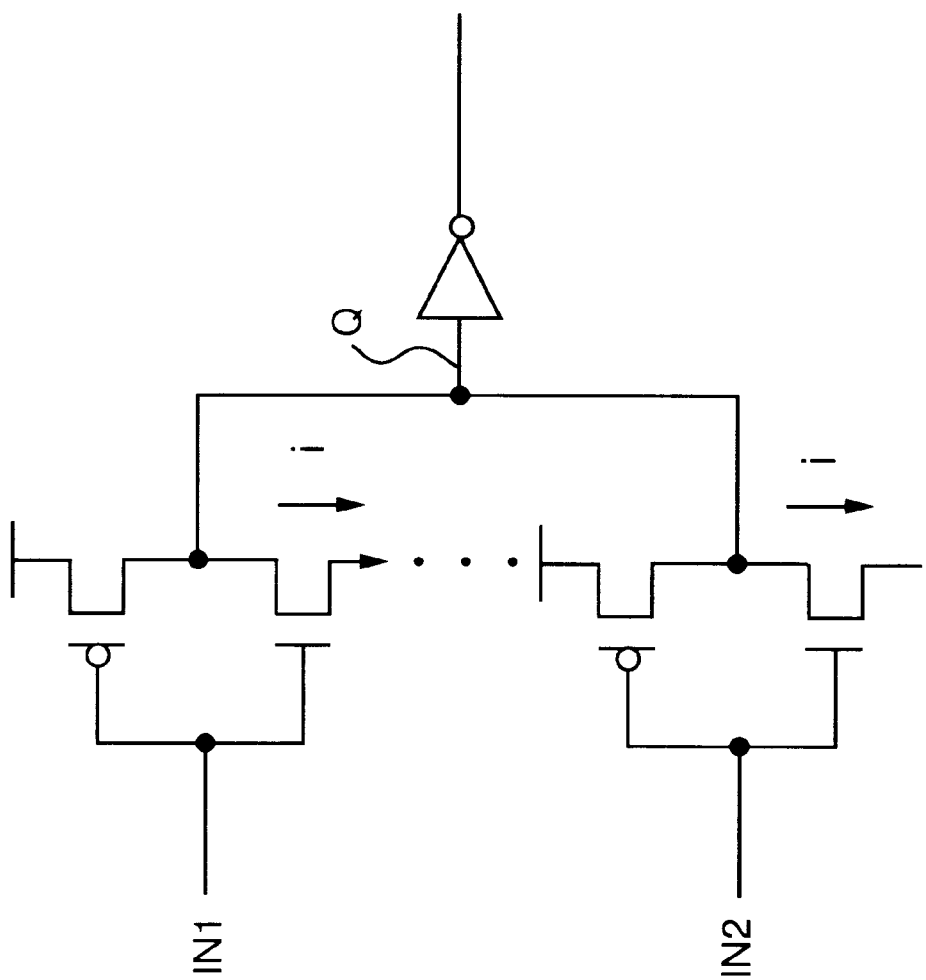
FIG. 2 is a circuit diagram of an averaging circuit.
Figure 3:
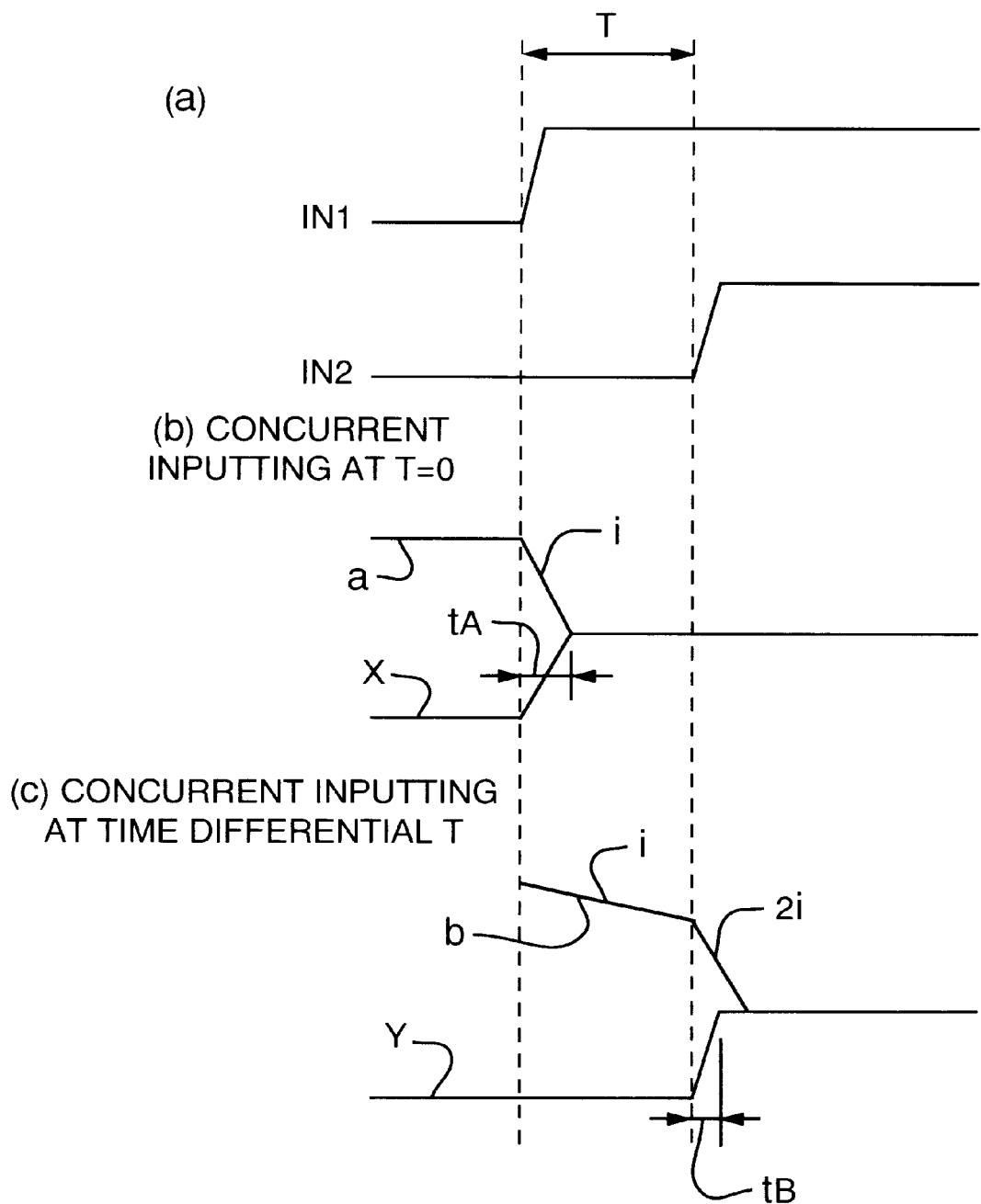
FIG. 3 illustrates the operation of an averaging circuit.

The averaging circuit includes two inverters, output sides of which are interconnected and an averaging signal is acquired from an output of the two inverters, as shown in FIG. 2.

An output signal of the averaging circuit has a time component of $T(\text{phase difference}) \times \frac{1}{2}$ where T is the phase difference of the two input signals.

A quantity of delay when two inputs of the averaging circuit are input at the same timing T=0 is assumed to be $t_A$ (FIG. 3b). Assume the electrical charge to be charged or discharged in order to invert the next stage to the averaging circuit is Q, and the driving current of two parallel connected inverters of the averaging circuit is i, $$t_A = Q/2i \tag{1}$$

On the other hand, a quantity of delay after two inputs are fed to the averaging circuit with a time difference of T (phase difference) is assumed to be $t_B$ (FIG. 3c). The electrical quantity to be charged or discharged in order to invert the next stage of the averaging circuit is Q. Initially, the electrical charge Q is extracted with a current i of the averaging circuit and, after lapse of time T, the electrical charge Q is extracted with a current 2i.

This may be represented by the following equation (2):

$$(Q-Ti)/2i = t_B \tag{2}$$

The left side (Q−Ti) denotes the residual electrical charge that needs to be extracted in order to invert the next stage which remains uninverted during the time T during which only one inverter is in operation.

Therefore, $$Q \geq Ti \tag{3}$$

This residual electrical charge Q−Ti is extracted with the two inverters being turned on. The time required to extract the electrical charge is $$t_B = (Q-Ti)/2i = (Q/2i) - (T/2) \tag{4}$$

Substituting the equation (1) into the equation (4), the following equation (5):

$$t_B = t_A - (T/2) \tag{5}$$

Therefore, if the next stage is not inverted during the time difference T of two inputs, with only the sole inverter being in operation, the averaging circuit has a time component equal to ½ of the time difference of two inputs.

Figure 4:
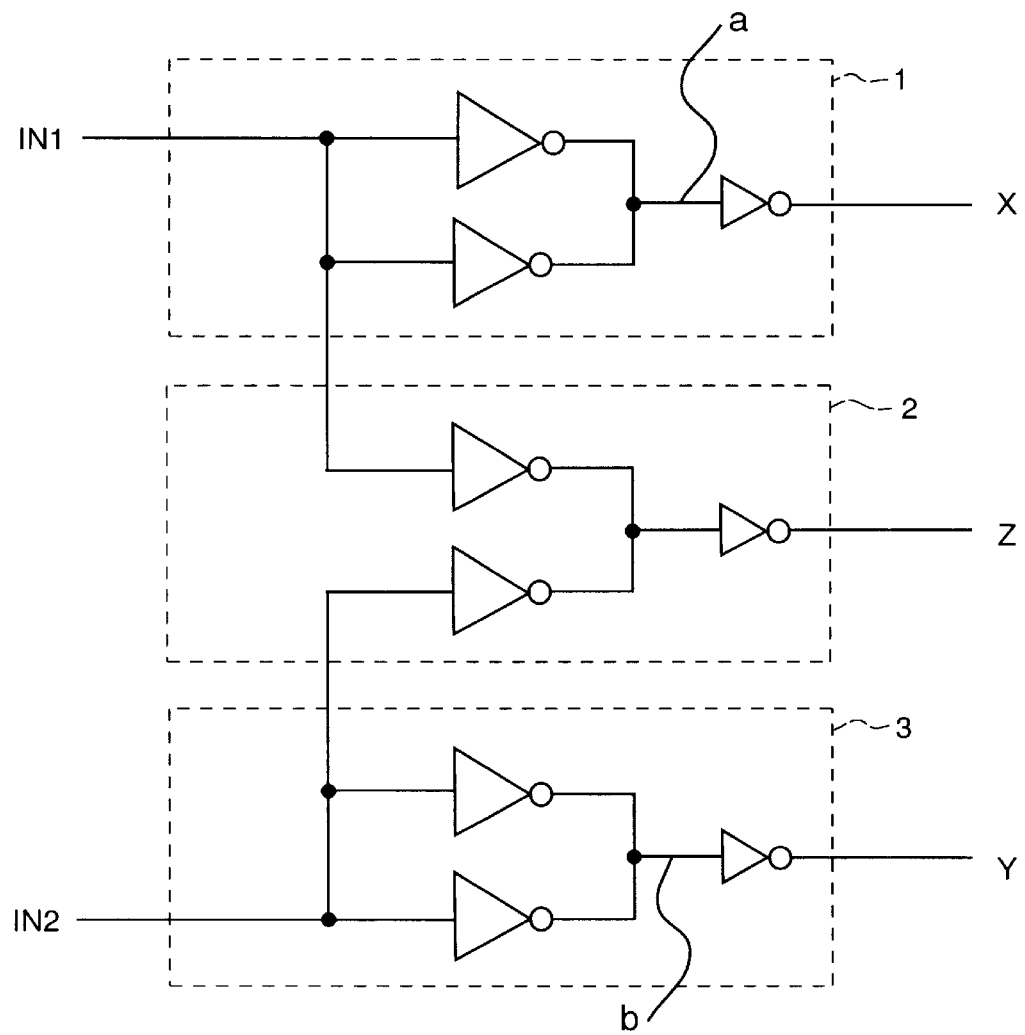
FIG. 4 illustrates the operation of the averaging circuit.

A circuit shown in FIG. 4 is considered for aiding the understanding. Two inputs IN1, IN2 are entered simultaneously, amounts of delay $t_X$, $t_Y$ of averaging circuits 1, 3 are represented by $$Q/2i = t_X \text{ (fixed delay)} \tag{6}$$

$$Q/2i = t_Y \text{ (fixed delay)} \tag{7}$$

whereas, if the two inputs IN1, IN2 are entered with a phase difference of time T, the output delay time since the two inputs of the averaging circuit 2 are of the H level after time T is represented by the equation (8):

$$(Q-Ti)/2i = t_Z \quad (Q \geq Ti) \tag{8}$$

In the equation (8), (Q/2i) is equal to the equations (6) and (7), so that, by substituting the equations (6) and (7), we obtain:

$$t_X - (Ti/2i) = t_Z$$

$$t_Y - (Ti/2i) = t_Z$$

$$t_X - t_Z = (Ti/2i) = T/2 \tag{9}$$

$$t_Y - t_Z = (Ti/2i) = T/2 \tag{10}$$

Thus, when two inputs are fed to an averaging circuit with a time difference equal to T, a difference in time delay of (T/2) is obtained for the fixed delay obtained at the time of concurrent signal inputting.

Figure 5A:
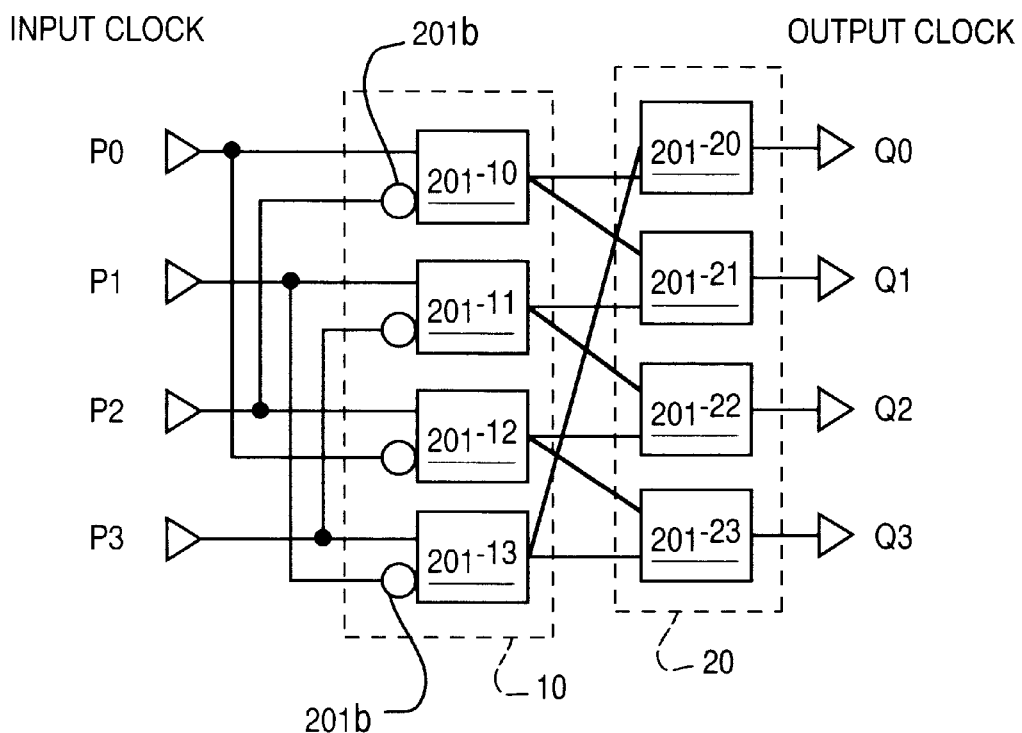
FIGS. 5a and 5b are block diagrams of a first specified example of the present invention and an averaging circuit, respectively.
Figure 5B:
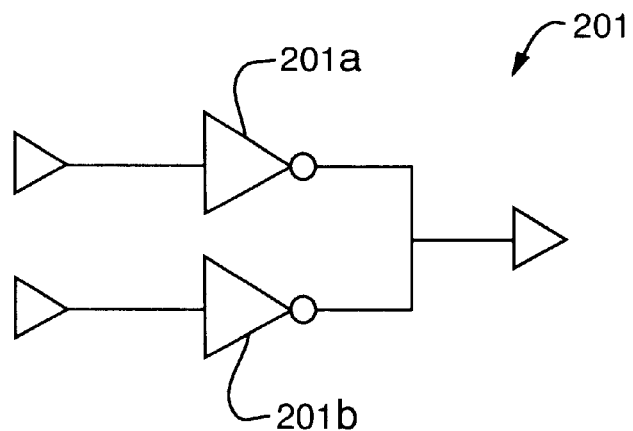
Figure 6:
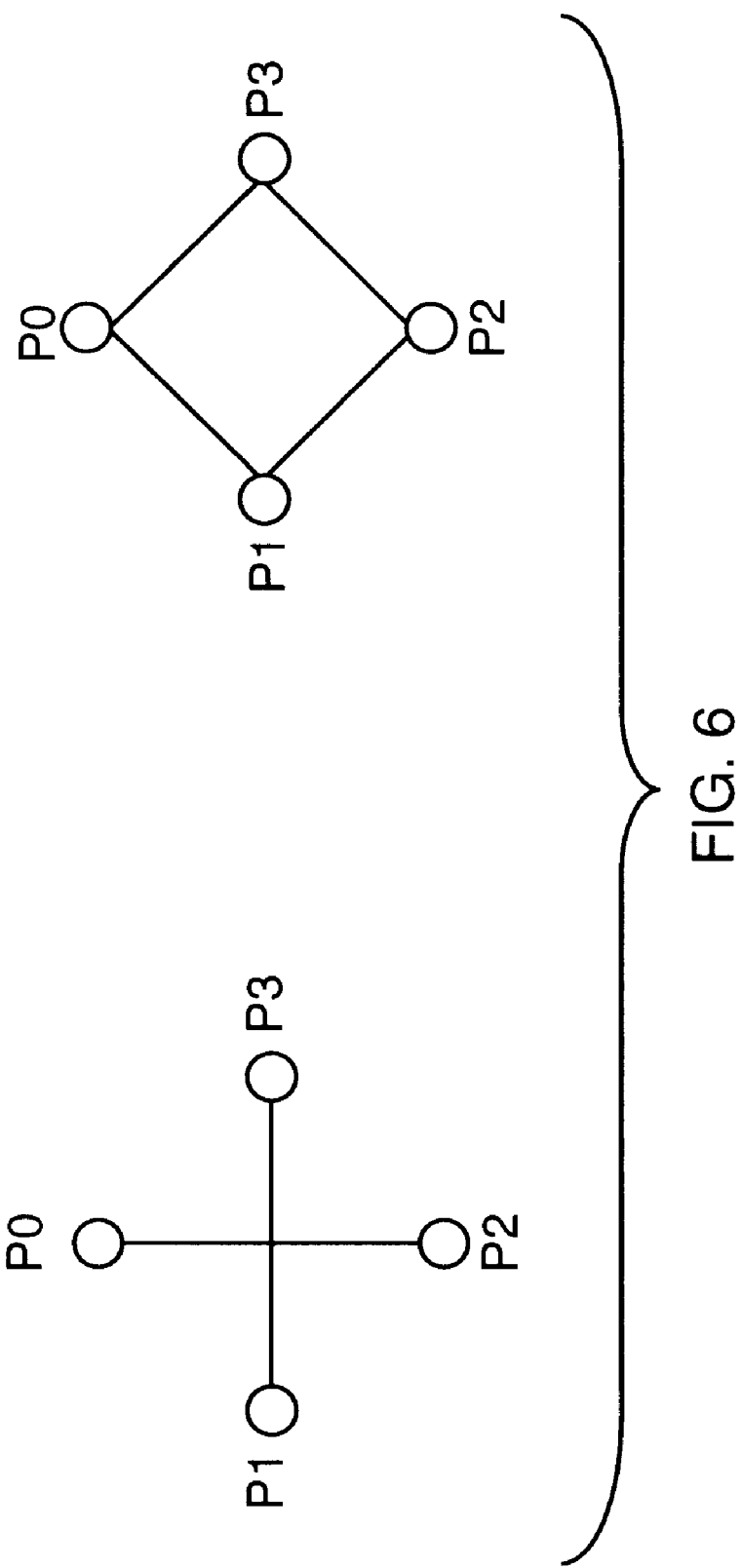
FIG. 6 shows the phase state of clock signals according to a first specified example of the present invention and the averaging out manner.

Next, a circuit of FIG. 5 is explained.

Figure 7:
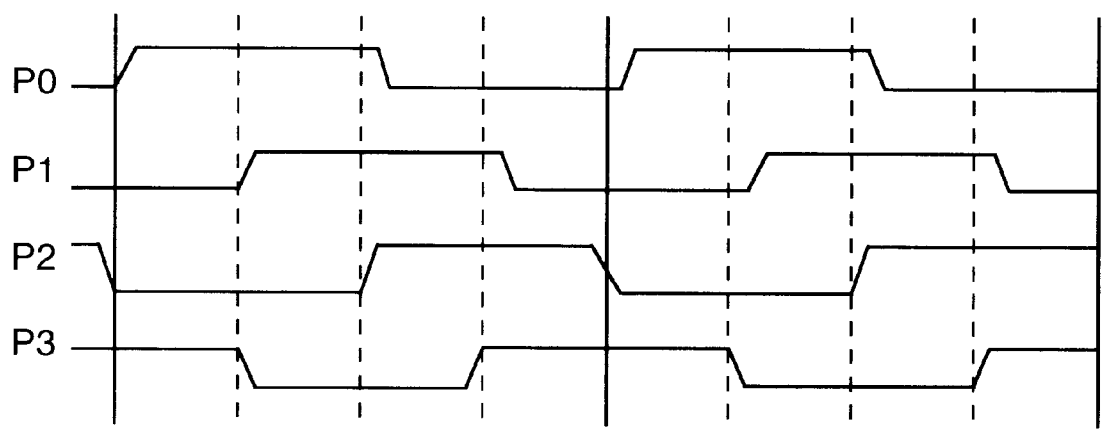
FIG. 7 is a timing chart of clock signals of the first specified example.

In FIG. 5, $P_0$ to $P_3$ are four clock signals input to an averaging circuit. Referring to FIG. 7, the clock signals are delayed in phase each by $\pi/4$ in the order of $P_0$ to $P_3$, with these clock signals $P_0$ to $P_3$ having phase errors of $E_0$ to $E_3$, respectively.

The clock signal $P_0$ is input to an averaging circuit 201-10, with an inverted signal thereof being input to an averaging circuit 201-12. The clock signal $P_1$ is input to an averaging circuit 201-11, with an inverted signal thereof being input to an averaging circuit 201-13. The clock signal $P_2$ is input to an averaging circuit 201-12, with an inverted signal thereof being input to an averaging circuit 201-10. Similarly, the clock signal $P_3$ is input to an averaging circuit 201-13, with an inverted signal thereof being input to an averaging circuit 201-11. In this circuitry, the averaging circuits 201-10 to 201-13 make up a first averaging circuit set, this circuit set averaging the phase errors of clock signals having 180° phase difference to each other.

An output signal of the averaging circuit 201-10 is input to averaging circuits 201-20 and 201-21. An output signal of the averaging circuit 201-11 is input to averaging circuits 201-21 and 201-22. An output signal of the averaging circuit 201-12 is input to averaging circuits 201-22 and 201-23. Similarly, an output signal of the averaging circuit 201-13 is input to averaging circuits 201-23 and 201-20. At an output of the averaging circuit 201-20, a clock $Q_0$ having a phase error of respective clock signals is issued. At an output of the averaging circuit 201-21, a clock $Q_1$ having a phase error of respective clock signals averaged out is issued. At an output of the averaging circuit 201-22, a clock $Q_2$ having a phase error of respective clock signals averaged out is issued. Similarly, at an output of the averaging circuit 201-23, a clock $Q_3$ having a phase error of respective clock signals averaged out is issued.

In this circuitry, the averaging circuits 201-20 to 201-23 make up a second averaging circuit set 20, this circuit set averaging out the phase errors of the clock signals having neighboring (adjacent) phases to each other.

The averaging between clocks with 180° phase difference in the first averaging circuit set (diagonal averaging) is explained.

$$\{P_0+(P_2-\pi)\}/2=\{(E_0+0\times 2\pi)+(E_2+(2/4)\times 2\pi-\pi)\}/2=(E_0+E_2)/2 \quad (11)$$

$$\{P_1+(P_3-\pi)\}/2=\{(E_1+(1/4)\times 2\pi)+(E_3+(3/4)\times 2\pi-\pi)\}/2=\{(E_1+E_3)/2\}+(1/4)\times 2\pi \quad (12)$$

$$\{P_2+(P_0+2\pi-\pi)\}/2=\{(E_2+(2/4)\times 2\pi)+(E_0+0\times 2\pi+2\pi-\pi)\}/2=\{(E_0+E_2)/2\}+(2/4)\times 2\pi \quad (13)$$

$$\{P_3+(P_1+2\pi-\pi)\}/2=\{(E_3+(3/4)\times 2\pi)+(E_1+(1/4)\times 2\pi+2\pi-\pi)\}/2=\{(E_1+E_3)/2\}+(3/4)\times 2\pi \quad (14)$$

The averaging of clocks with neighboring clocks in the second averaging circuit set (neighboring averaging) is hereinafter explained.

$$\{\text{equation}(1)+\text{equation}(2)\}/2=(E_0+E_1+E_2+E_3)/4=\{(1/4)\times 2\pi\}/2 \quad (15)$$

$$\{\text{equation}(2)+\text{equation}(3)\}/2=(E_0+E_1+E_2+E_3)/4=\{(3/4)\times 2\pi\}/2 \quad (16)$$

$$\{\text{equation}(3)+\text{equation}(4)\}/2=(E_0+E_1+E_2+E_3)/4=\{(5/4)\times 2\pi\}/2 \quad (17)$$

$$\{\text{equation}(4)+\text{equation}(1)+2\pi\}/2=(E_0+E_1+E_2+E_3)/4=\{(7/4)\times 2\pi\}/2 \quad (18)$$

such that phase errors of respective clock signals are averaged out and the phase difference of the respective phase differences is kept at $(2/4)\pi$.

Second Specified Example

Figure 8:
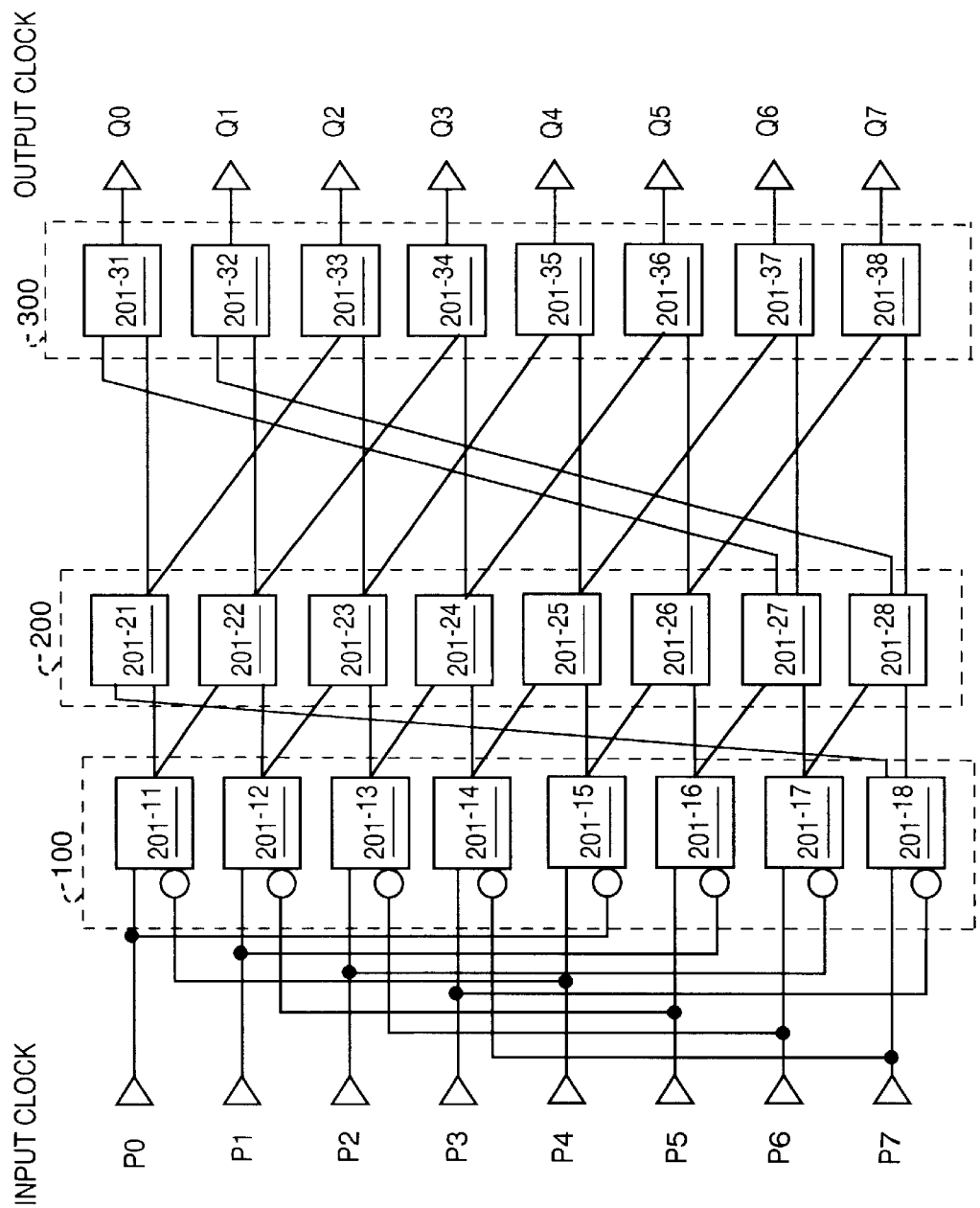
FIG. 8 is a block diagram of a second specified example of the present invention.
Figure 9:
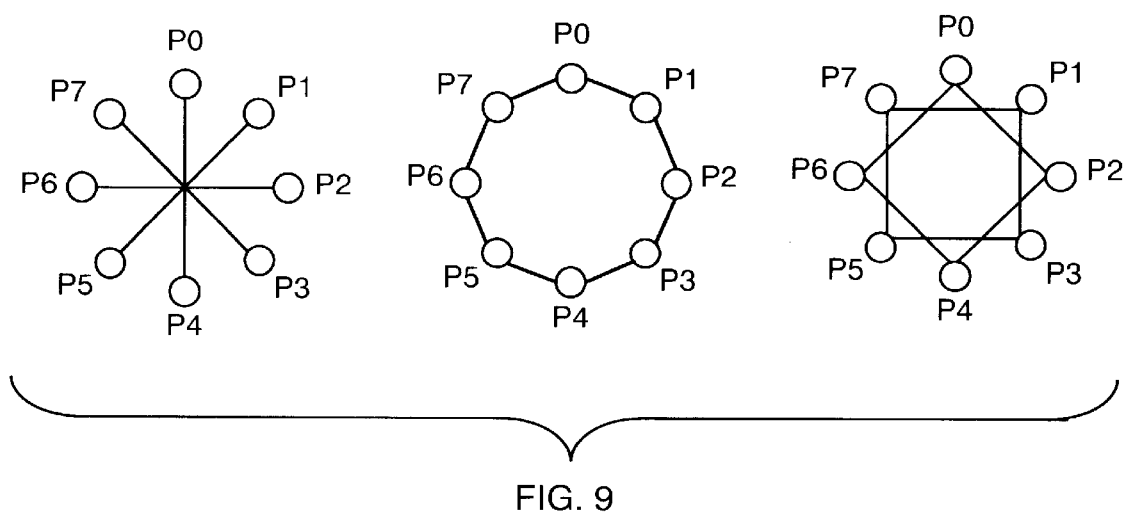
FIG. 9 shows the Phase State of clock signals according to a second specified example of the present invention and the averaging out manner.
Figure 10:
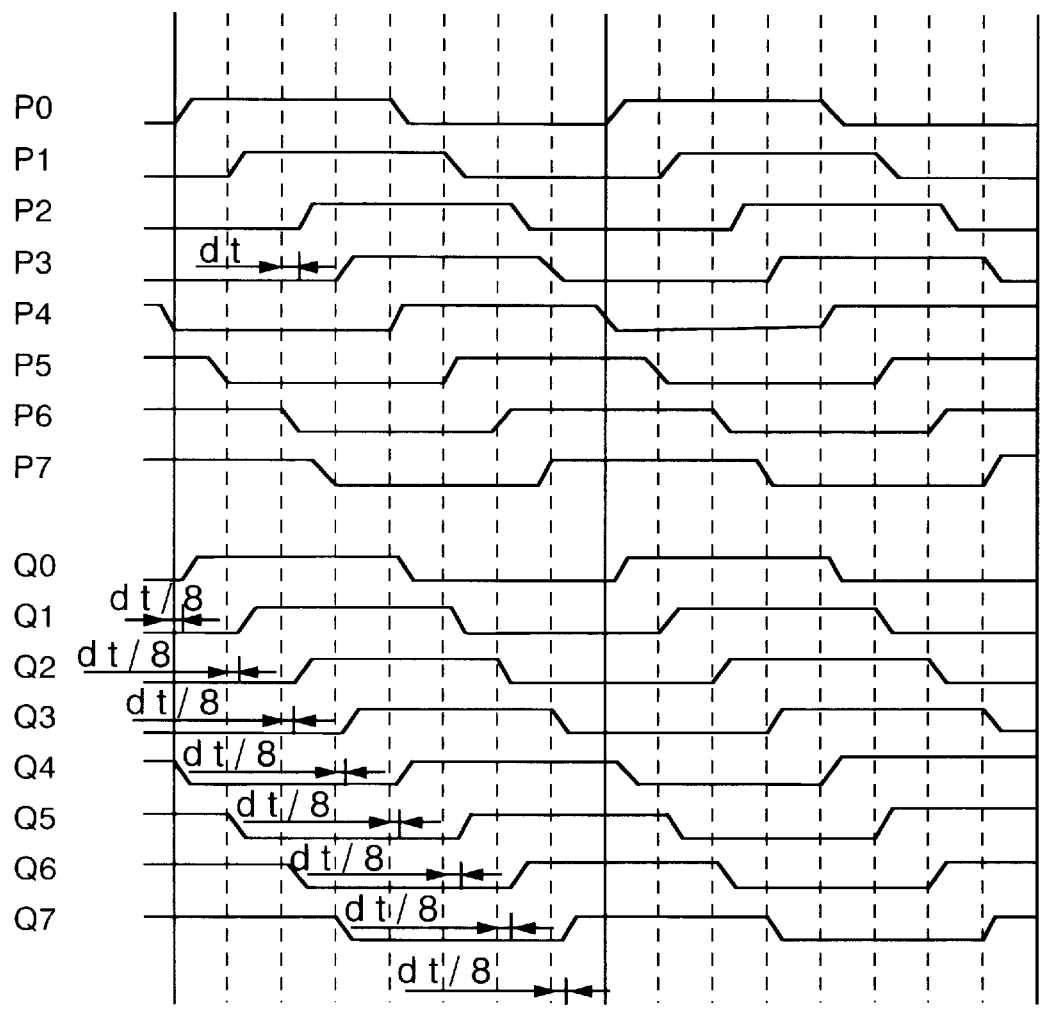
FIG. 10 is a timing chart of clock signals of the second specified example.
Figure 11:
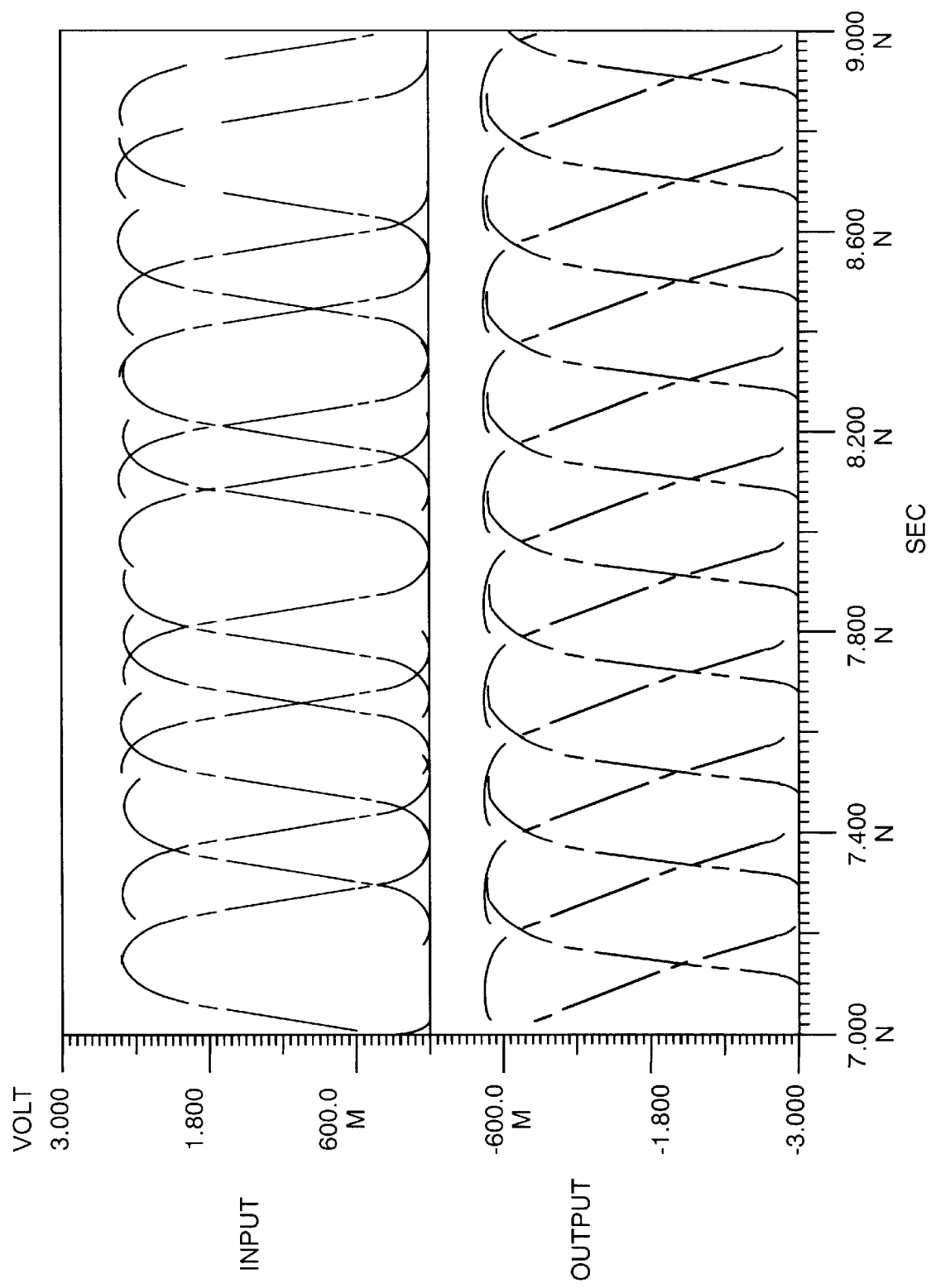
FIG. 11 illustrates the results of simulation of the second specified example.

FIGS. 8 to 11 shows a second specified example of the present invention, with FIG. 8 being a block diagram, FIG. 9 schematically showing the phase relation of the respective clocks and the mode of averaging out, FIG. 10 showing a waveform diagram and FIG. 11 showing the result of simulation.

As an averaging circuit of the present embodiment, the same circuit as that used in the first specified example is used.

This specified example uses eight-phase clocks. In the present specified example, a first averaging circuit set 100 averages out diagonal clock signals (180°), and a second averaging circuit set 200 averages out neighboring clock signals (45°), whilst a third averaging circuit set 300 averages out every second clock signals (90°).

FIG. 9 schematically shows the averaging modes. $P_0$ to $P_7$ denote eight phase clocks. These clocks are arrayed circularly to indicate the relation (states) of the respective phases. In the present specified example, whilst the averaging is made between diagonal phases (180°), neighboring phases (45°) and every second phases (90°), as described above, there is no limitation to the order in which the averaging is made. For example, if the errors of the respective phases are $E_0$ to $E_7$ phase errors of the clock signals of the respective phases passed through this circuit are as follows: Outputs of the first averaging circuit set 100:

$(E_0+E_4)/2$ $(E_1+E_5)/2$ $(E_2+E_6)/2$ $(E_3+E_7)/2$ $(E_4+E_0)/2$ $(E_5+E_1)/2$ $(E_6+E_2)/2$ $(E_7+E_3)/2$

Outputs of the second averaging circuit set 200 are:

$(E_0+E_4+E_1+E_5)/4$ $(E_1+E_5+E_2+E_6)/4$ $(E_2+E_6+E_3+E_7)/4$ $(E_3+E_7+E_4+E_0)/4$ $(E_4+E_0+E_5+E_1)/4$ $(E_5+E_1+E_6+E_2)/4$ $(E_6+E_2+E_7+E_3)/4$ $(E_7+E_3+E_0+E_4)/4$

Outputs of the third averaging circuit set 300 are:

$(E_0+E_4+E_1+E_5+E_2+E_6+E_3+E_7)/8$ $(E_1+E_5+E_2+E_6+E_3+E_7+E_4+E_0)/8$ $(E_2+E_6+E_3+E_7+E_4+E_0+E_5+E_1)/8$ $(E_3+E_7+E_4+E_0+E_5+E_1+E_6+E_2)/8$ $(E_4+E_0+E_5+E_1+E_6+E_2+E_7+E_3)/8$ $$(E_5+E_1+E_6+E_2+E_7+E_3+E_0+E_4)/8$$

$$(E_6+E_2+E_7+E_3+E_0+E_4+E_1+E_5)/8$$

$$(E_7+E_3+E_0+E_4+E_1+E_5+E_2+E_6)/8$$

If the clocks are passed through the present circuit, the phase errors are progressively averaged out from one circuit set to another, such that ultimately the entire phase components are completely averaged out. If this phase averaging is shown by the timing chart of FIG. 10, when the eight-phase input signals $P_0$ to $P_7$ are passed through the circuit of FIG. 8 to output signals $Q_0$ to $Q_7$, the phase error td of the clock $P_2$ is equally distributed in an amount of td/8 to each of $Q_0$ to $Q_7$.

FIG. 11 shows the result of simulation of this circuit.

This simulation was carried out in a 0.25 μm CMOS process. The phase error averaging is performed on 1.6 n period (622 MHz) eight-phase clocks (ideal phase difference of 200 ps). By being passed through the circuit of this specified example, the phase error of the input signal with a maximum phase error of 100 ps (50 ps) is decreased to a phase error of 5 ps (2.5%) or less. The multi-phase clock signals, containing phase errors, and the multi-phase clock signals, freed of the phase errors, are shown in an upper portion and in a lower portion of FIG. 11, respectively. The phase error is not reduced completely to zero because of the incomplete averaging circuit. However, if the clocks are passed once again through the present circuit, the phase errors are further reduced to approximately one/tenth.

Third Specified Example

Figure 12A:
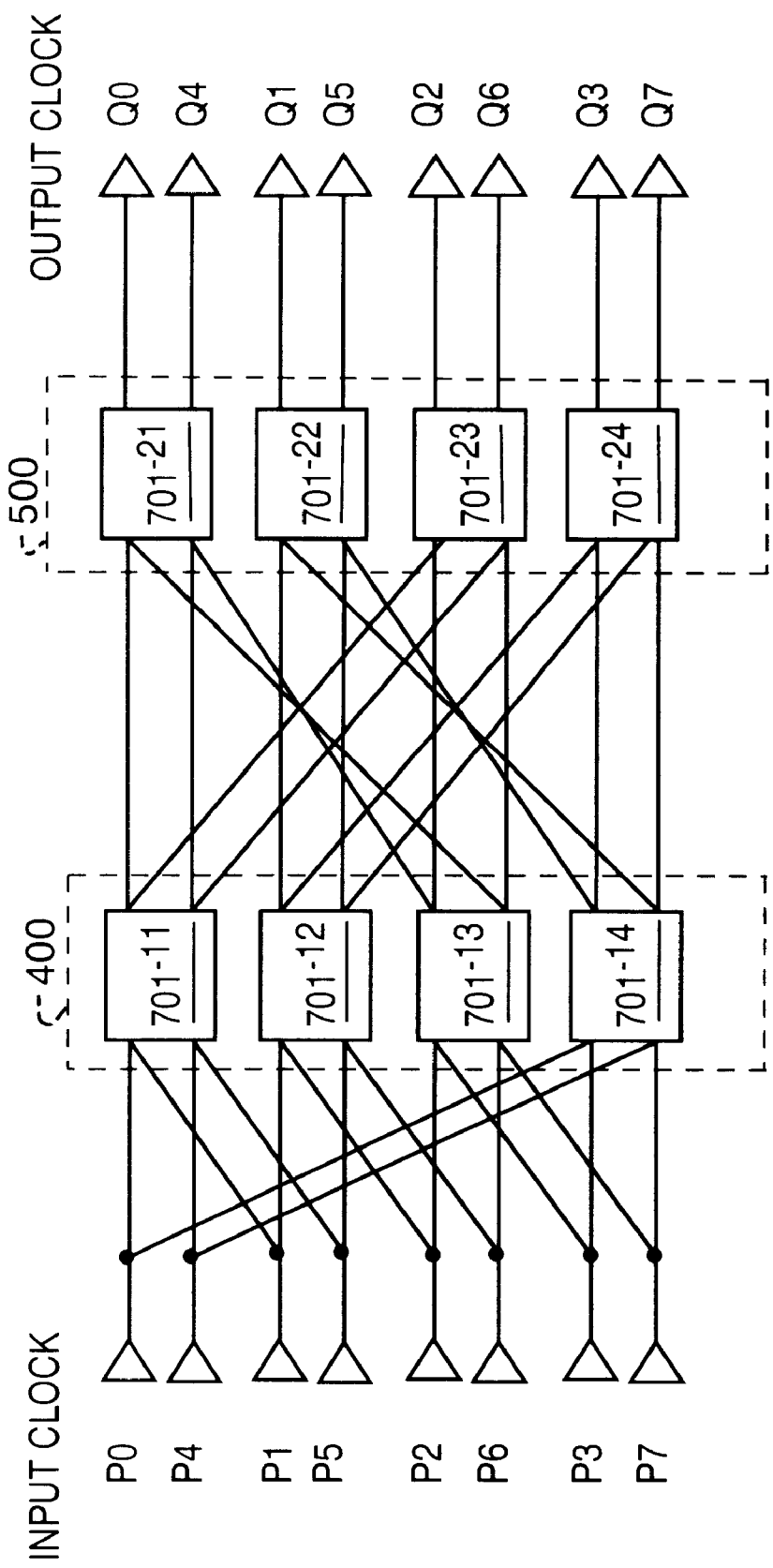
FIGS. 12a and 12b are block diagrams of a third specified example of the present invention and a circuit diagram of a modified averaging circuit, respectively.
Figure 12B:
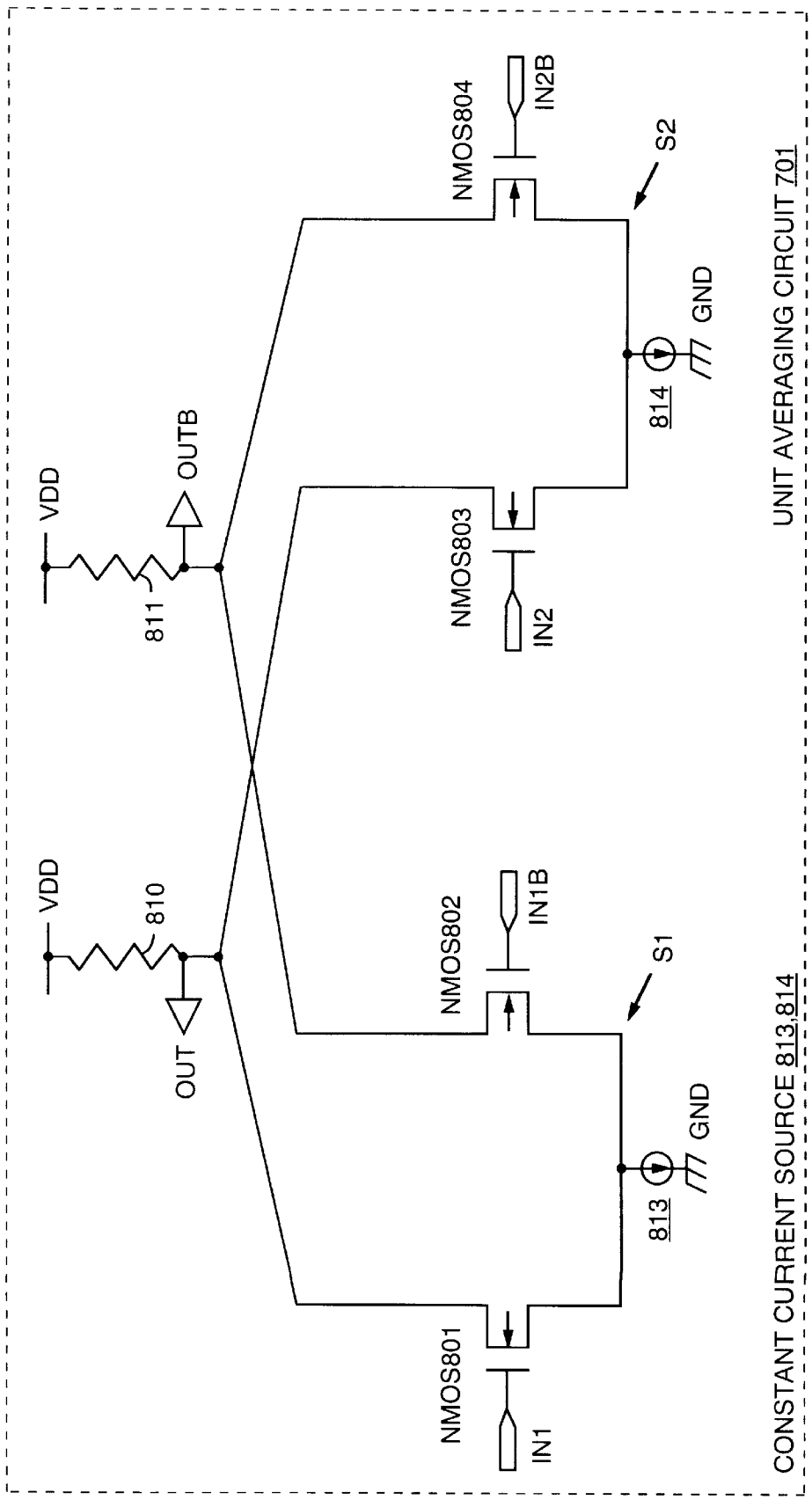
Figure 13:
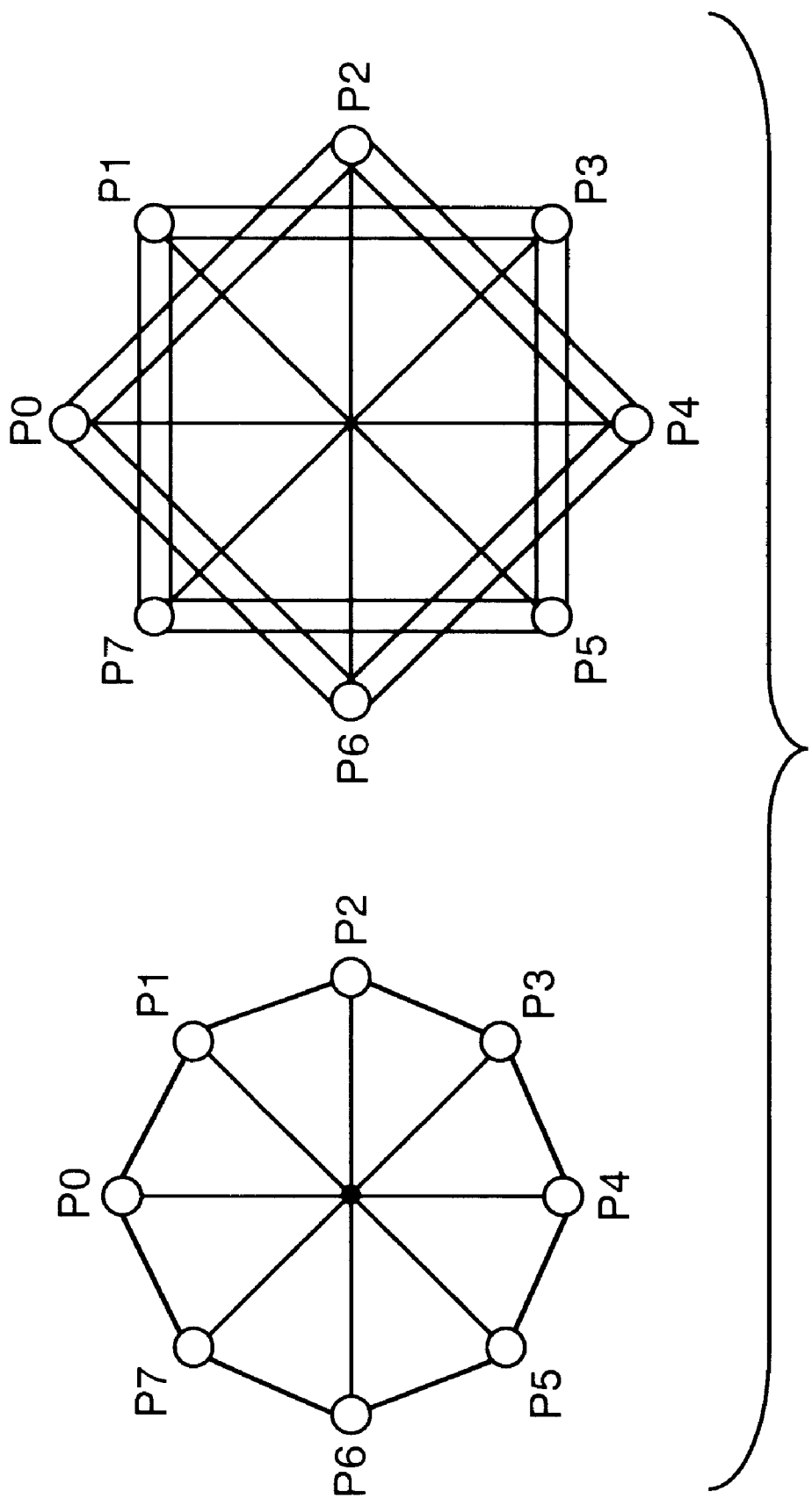
FIG. 13 schematically shows the averaging relation by a third specified example of the present invention.

FIGS. 12 and 13 show a third specified example of the present invention. Specifically, FIG. 12a and FIG. 12b show a block diagram and a unit averaging circuit, respectively, and FIG. 13 schematically shows the phase relation of respective clocks and manners (modes) of averaging out the phase errors of the clocks.

In these figures, there are shown a pulse signal phase averaging circuit 701 in which phase errors of n pulses having different phase errors are averaged out to produce n pulses having averaged phase errors, wherein a unit averaging circuit is formed which comprises a first differential pair S1, a load 810, 811 of each transistor of the first differential pair S1, and a second differential pair S2 connected in parallel with the first differential pair S1, each of the first and second differential pairs S1, S2 being fed with pulse signals having phases different from each other by π radians to average out the phase errors of four pulses input to the first and second differential pairs S1, S2. n/2 of the unit averaging circuits 701 are provided to constitute an averaging circuit set for averaging out the phase errors of the n pulses. There are provided $\log_2$ (n/2) stages of the averaging circuit sets.

There is also shown a pulse signal phase averaging circuit wherein the n pulses are input to two different unit averaging circuits of a first set 400 of the unit averaging circuits and wherein outputs of respective unit averaging circuits of the first averaging circuit set 400 are input to two different unit averaging circuits of a second set 500 of the unit averaging circuits provided downstream of the first averaging circuit set 400.

There is also shown a pulse signal phase averaging circuit wherein outputs of respective unit averaging circuits of the upstream side averaging circuit set 400 are input to different two of the unit averaging circuits 500 provided downstream of the upstream side averaging circuit set 400.

The averaging circuit used in this circuitry includes a first differential pair S1, made up of FETs 801, 802, loads 810, 811 of respective transistors of the differential pair S1, and a second differential pair S2, made up of FETs 803, 804, connected in parallel with the first differential pair S1. The differential pairs S1, S2 are fed with pulse signals IN1, IN1B; IN2, IN2B, having Phases different by π radians, to average out phase errors of four pulses input to the first differential pair S1 and the second differential pair S2, respectively.

FIG. 12a shows a block diagram of the third specified example.

A first differential pair of an averaging circuit 701-11 is fed with clock signals $P_0$, $P_4$ having phases 180° different from each other. A second differential pair of the averaging circuit 701-12 is fed with neighboring clock signals $P_1$, $P_5$ having phases 180° different from each other. Similarly, a first differential pair of an averaging circuit 701-12 is fed with clock signals $P_1$, $P_5$ having phases 180° different from each other. A second differential pair of the averaging circuit 701-12 is fed with neighboring clock signals $P_2$, $P_6$ having phases 180° different from each other. A first differential pair of an averaging circuit 701-13 is fed with clock signals $P_2$, $P_6$ having phases 180° different from each other. A second differential pair of the averaging circuit 701-13 is fed with neighboring clock signals $P_3$, $P_7$ having phases 180° different from each other. A first differential pair of an averaging circuit 701-14 is fed with clock signals $P_3$, $P_7$ having phases 180° different from each other. A second differential pair of the averaging circuit 701-14 is fed with neighboring clock signals $P_0$, $P_4$ having phases 180° different from each other. The averaging circuits 701-11 to 701-14 make up a first averaging circuit set 400 to effect averaging.

A first differential pair of an averaging circuit 701-21 is fed with output signals of the averaging circuit 701-11 having phases 180° different from each other. A second differential pair of the averaging circuit 701-21 is fed with output signals of the averaging circuit 701-13 having phases offset 90° from each other. A first differential pair of an averaging circuit 701-22 is fed with output signals of the averaging circuit 701-12 having phases 180° different from each other. A second differential pair of the averaging circuit 701-22 is fed with output signals of the averaging circuit 701-14 having phases offset 90° from each other. A first differential pair of an averaging circuit 701-23 is fed with output signals of the averaging circuit 701-13 having phases 180° different from each other. A second differential pair of the averaging circuit 701-23 is fed with output signals of the averaging circuit 701-11 having phases offset 90° from each other. A first differential pair of an averaging circuit 701-24 is fed with output signals of the averaging circuit 701-14 having phases 180° different from each other. A second differential pair of the averaging circuit 701-24 is fed with output signals of the averaging circuit 701-12 having phases offset 90° from each other.

The averaging circuits 701-11 to 701-14 make up a first averaging circuit set 400, whilst the averaging circuits 701-21 to 701-24 make up a second averaging circuit set 500.

In this circuit arrangement, the clock signals are passed through the first and second circuit sets with different combinations to effect progressive averaging to average out the phase errors over the entire clock signals as the phase difference of the clock signals is maintained.

The averaging of the multi-clocks is hereinafter explained. In the present specified example, eight phase clocks are used. In the present example, averaging is made between neighboring phase angles (45°) and diagonally opposite phase angles (135°) and between every second phase angles (90°) and between diagonal angles (180°). FIG. 13 schematically shows the relation of averaging. $P_0$ to $P_7$ denote eight-phase clocks. These clocks are arrayed circularly to indicate the relation (or states) of the respective phases. In the present specified example, whilst the averaging is made between neighboring phases (45°) and diagonally opposite phases (180°) and between every second phases (90°) and diagonally opposite phases (180°), as described above, there is no limitation to the order in which the averaging is made. For example, if the errors of the respective phases are $E_0$ to $E_7$, the phase errors of the clock signals of the respective phases, passed through the present circuit, are sequentially averaged out, as shown below, such that ultimately the entire phase components are completely averaged out.

Specifically, the outputs of the first averaging circuit set 400 are as follows:

$$(E_0+E_4+E_1+E_5)/4$$

$$(E_1+E_5+E_2+E_6)/4$$

$$(E_2+E_6+E_3+E_7)/4$$

$$(E_3+E_7+E_4+E_0)/4$$

$$(E_4+E_0+E_5+E_1)/4$$

$$(E_5+E_1+E_6+E_2)/4$$

$$(E_6+E_2+E_7+E_3)/4$$

$$(E_7+E_3+E_0+E_4)/4$$

On the other hand, the outputs of the second averaging circuit set 500 are as follows:

$$(E_0+E_4+E_1+E_5+E_2+E_6+E_3+E_7)\times 2/16$$

$$(E_1+E_5+E_2+E_6+E_3+E_7+E_4+E_0)\times 2/16$$

$$(E_2+E_6+E_3+E_7+E_4+E_0+E_5+E_1)\times 2/16$$

$$(E_3+E_7+E_4+E_0+E_5+E_1+E_6+E_2)\times 2/16$$

$$(E_4+E_0+E_5+E_1+E_6+E_2+E_7+E_3)\times 2/16$$

$$(E_5+E_1+E_6+E_2+E_7+E_3+E_0+E_4)\times 2/16$$

$$(E_6+E_2+E_7+E_3+E_0+E_4+E_1+E_5)\times 2/16$$

$$(E_7+E_3+E_0+E_4+E_1+E_5+E_2+E_6)\times 2/16$$

In the present embodiment, eight phase clocks are taken as an example. However, other suitable numbers of phases, such as 16-phase clocks, may also be used. In the present circuit, as compared to the first and second specified examples, an averaging circuit employing a differential circuit averages the diagonal signals by a sole circuit, thus advantageously reducing the number of stages necessary for full averaging.

Meanwhile, the averaging circuits used in the first and second specified examples and the averaging circuits used in the third specified example may be used in combination.

Thus, there is provided a pulse signal phase error averaging circuit arrangement in which phase errors of n pulses having different phase errors are averaged out to produce n pulses having averaged phase errors. Namely, a plurality of gates connected in parallel with one another are provided, outputs of the plural gates are interconnected to constitute a first unit averaging circuit adapted for averaging out phase errors of two or more pulses input to the gates, and a plurality of such first unit averaging circuits are provided to constitute a first averaging circuit set.

A second unit averaging circuit is formed which comprises a first differential pair, a load of each transistor of the first differential pair and a second differential pair connected in parallel with the first differential pair, each of the first and second differential pairs being fed with pulse signals having the phases different from each other by $\pi$ radians to average out the phase errors of four pulses input to the first and second differential pairs. There may be provided n/2 second unit averaging circuits to constitute a second averaging circuit set, whilst respective outputs of the unit averaging circuits of the first averaging circuit set may be input to the unit averaging circuit of the second averaging circuit set.

Also, there is provided a pulse signal phase error averaging circuit in which phase errors of n pulses having different phase errors are averaged out to produce n pulses having averaged phase errors. Namely, a first unit averaging circuit is formed which comprises a first differential pair, a load of each transistor of the first differential pair and a second differential pair connected in parallel with the first differential pair, each of the first and second differential pairs being fed with pulse signals having the phases different from each other by $\pi$ radians to average out the phase errors of four impulses input to the first and second differential pairs, n/2 of the unit averaging circuits being provided to constitute an averaging circuit set for averaging out the phase errors of four pulses fed to the first and second differential pairs to constitute a first averaging circuit set.

A second unit averaging circuit is formed which comprises a plurality of gates arranged in parallel with one another, outputs of the plural gates being interconnected to average out phase errors of two or more pulses input to the gates, a plurality of the second unit averaging circuits being provided to constitute a second averaging circuit set, respective outputs of the unit averaging circuits of the first averaging circuit set being adapted to be input to the unit averaging circuits of the second averaging circuit set.

Fourth Specified Example

Figure 14:
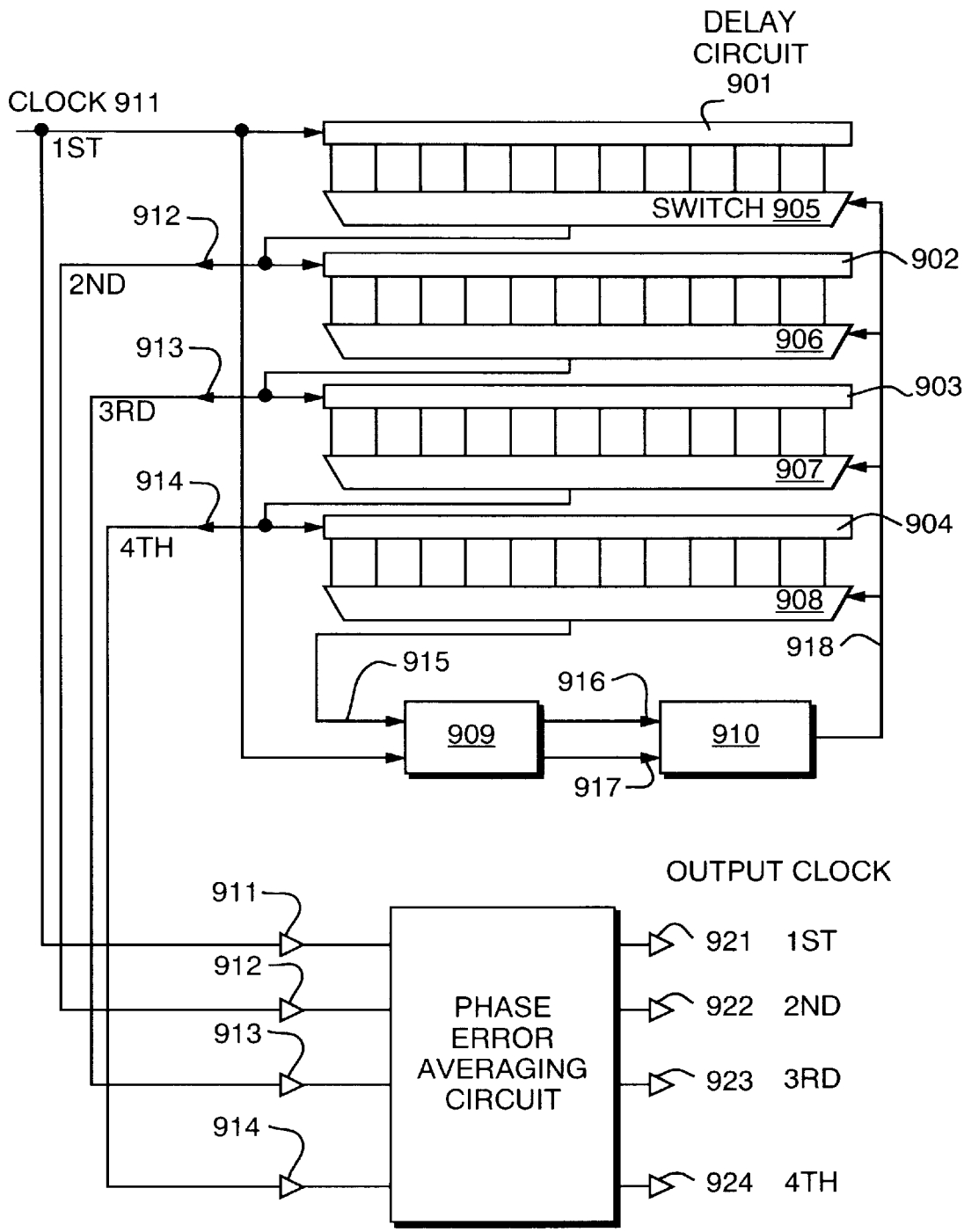
FIG. 14 is a block diagram showing a fourth specified example of the present invention.

A fourth specified example of the present invention is hereinafter explained with reference to a block diagram of FIG. 14.

In the present specified example, the present invention is applied to a digital PLL circuit adapted for generating multi-phase clocks or multiplied clocks.

By inputting an output of a digital PLL circuit, adapted for generating four-phase clock signals, to an averaging circuit of the present invention, it is possible to suppress phase errors or fluctuations of the periods of the multiplied clocks by the quantization errors of the digital PLL circuit.

Fifth Specified Example

Figure 15:
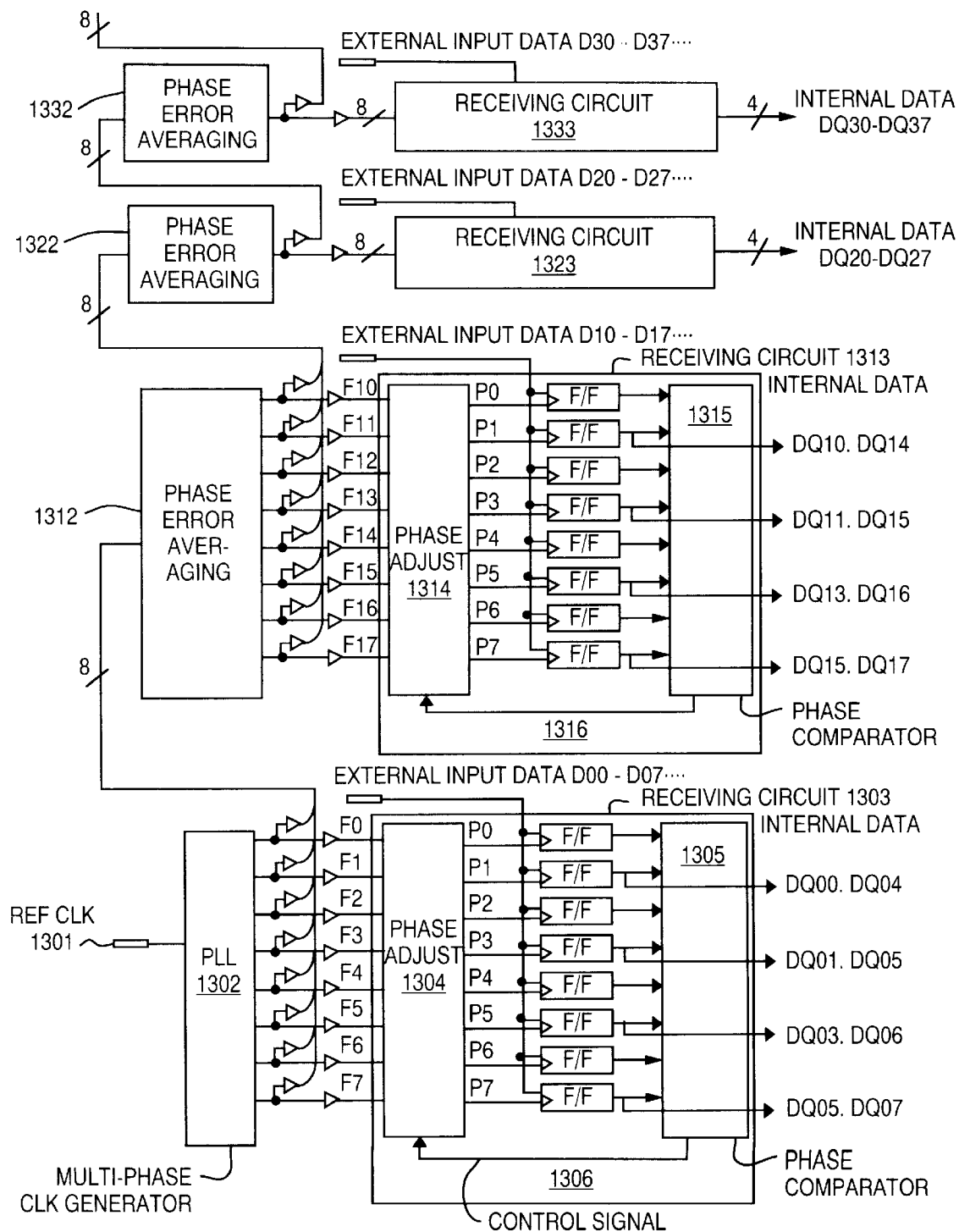
FIG. 15 is a block diagram showing a fifth specified example of the present invention.
Figure 21A:
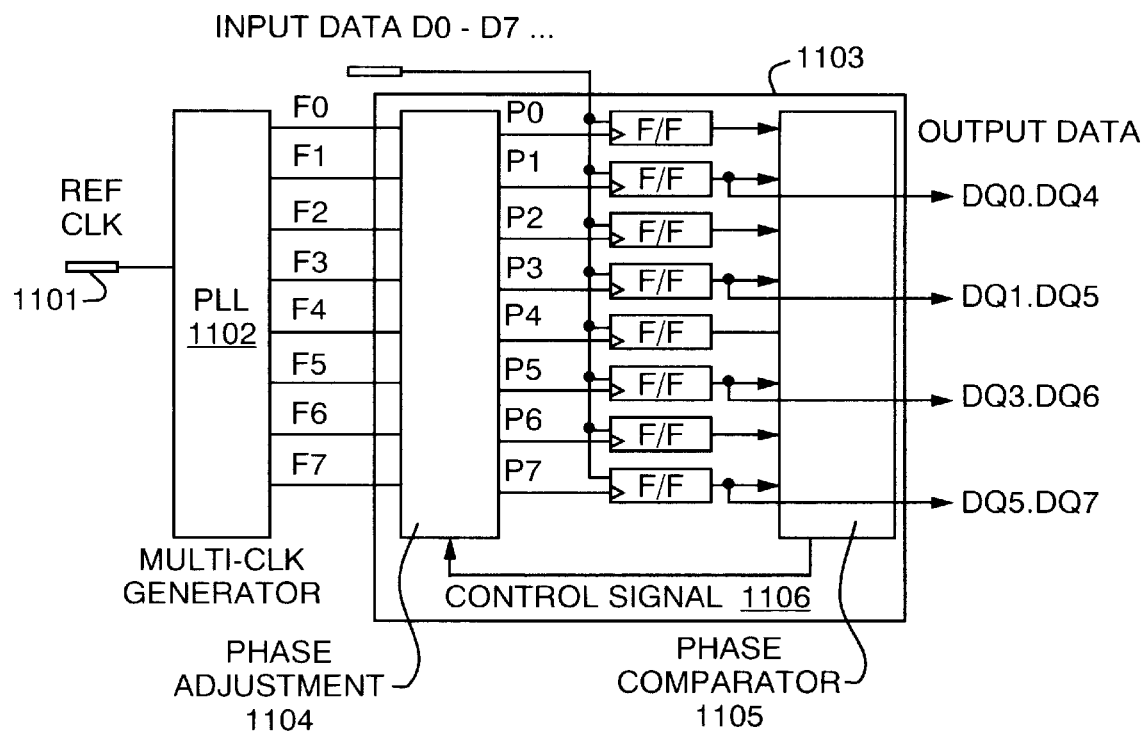
FIGS. 21a, 21b are a detailed block diagram of a conventional reception circuit and a timing chart therefor, respectively.
Figure 21B:
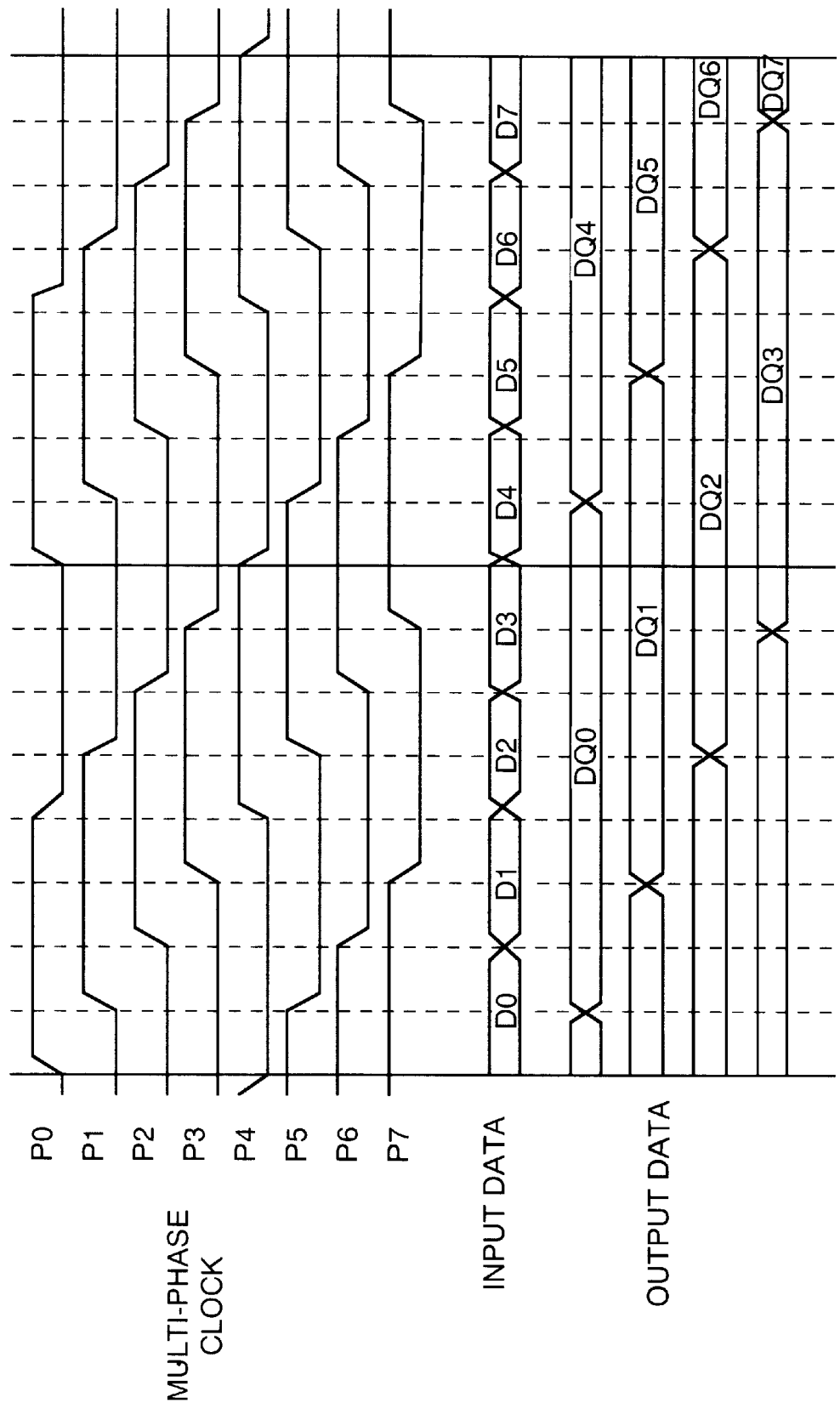

In the present fifth specified example, the present invention is applied to a circuit of FIG. 21 in which reception data are captured in separate latch circuits at respective phases of the multi-phase clocks and processed as parallel data in the LSI. FIG. 15 shows a block diagram of the present specified example.

A plurality of arrangements in which phase error averaging circuits 1312, 1322, 1332 of the eight-phase clock configuration according to the present invention replace PLLs of FIG. 21 are provided and the phase error averaging circuits are connected in tandem with the circuit of the configuration of FIG. 21 as an inchoative point. By this configuration, plural reception circuits can be controlled by a single PLL with a lesser phase-to-phase errors.

Thus, a data transmission apparatus of the fifth specified example is constructed so that multi-phase clocks generated in a multi-phase generating circuit are routed to a first device having phase error averaging circuit for averaging out phase errors of the multi-phase clocks as respective phases of the multi-phase clocks are kept, and so that an output of the phase error averaging circuit of the first device is routed to a second device having another phase error averaging circuit for averaging out phase errors of the multi-phase clocks as respective phases of the multi-phase clocks fed to the second device are kept.

Sixth Specified Example

Figure 16:
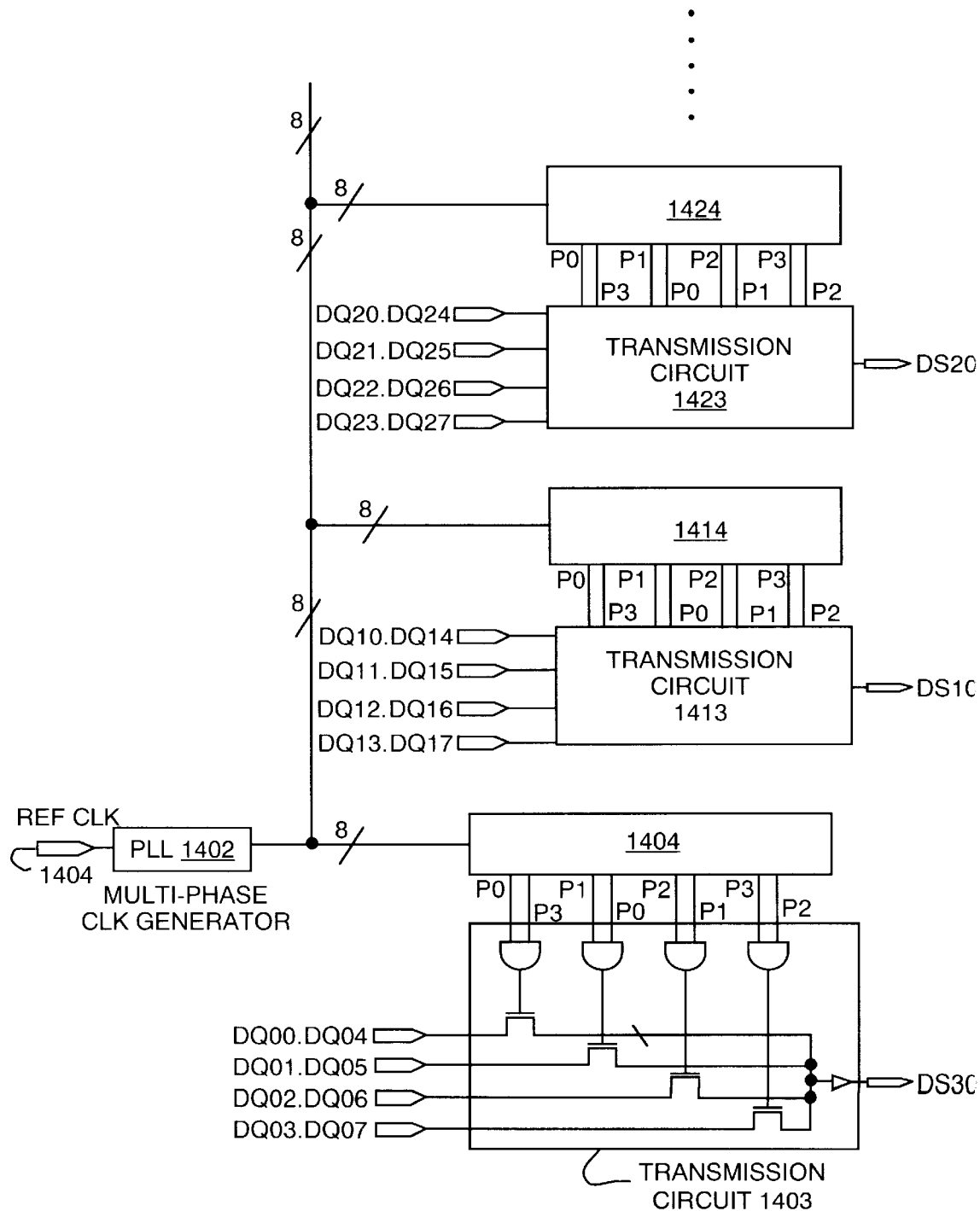
FIG. 16 is a block diagram showing a sixth specified example of the present invention.
Figure 17A:
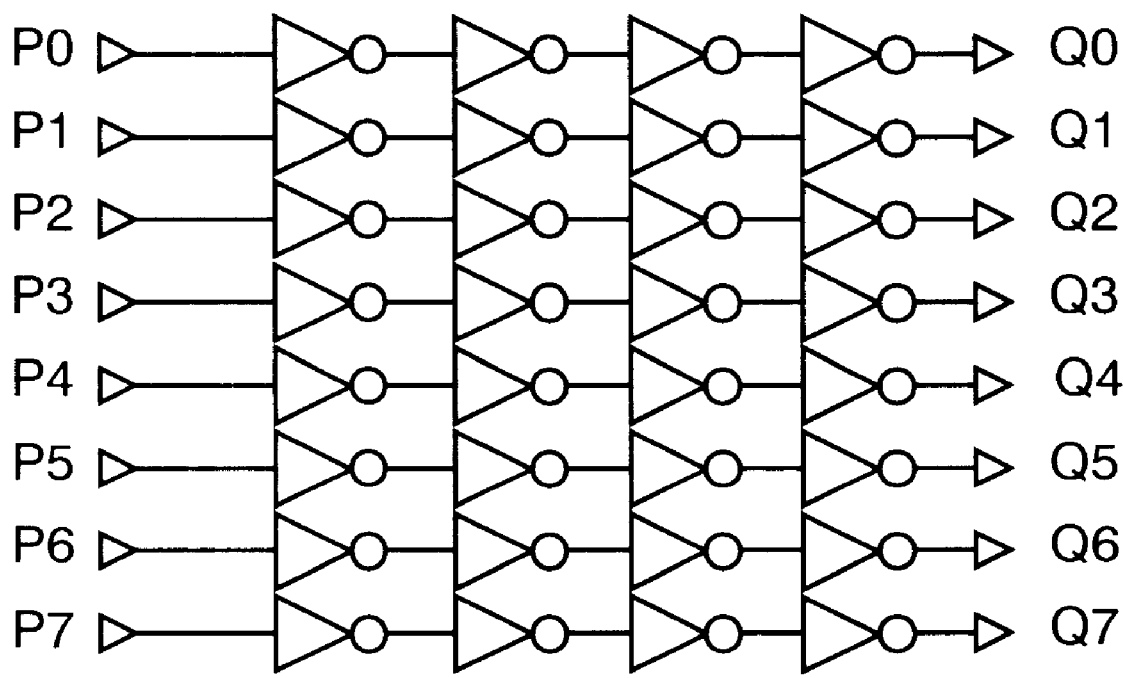
FIGS. 17a and 17b are a block diagram of a conventional technique and a timing chart thereof, respectively.
Figure 17B:
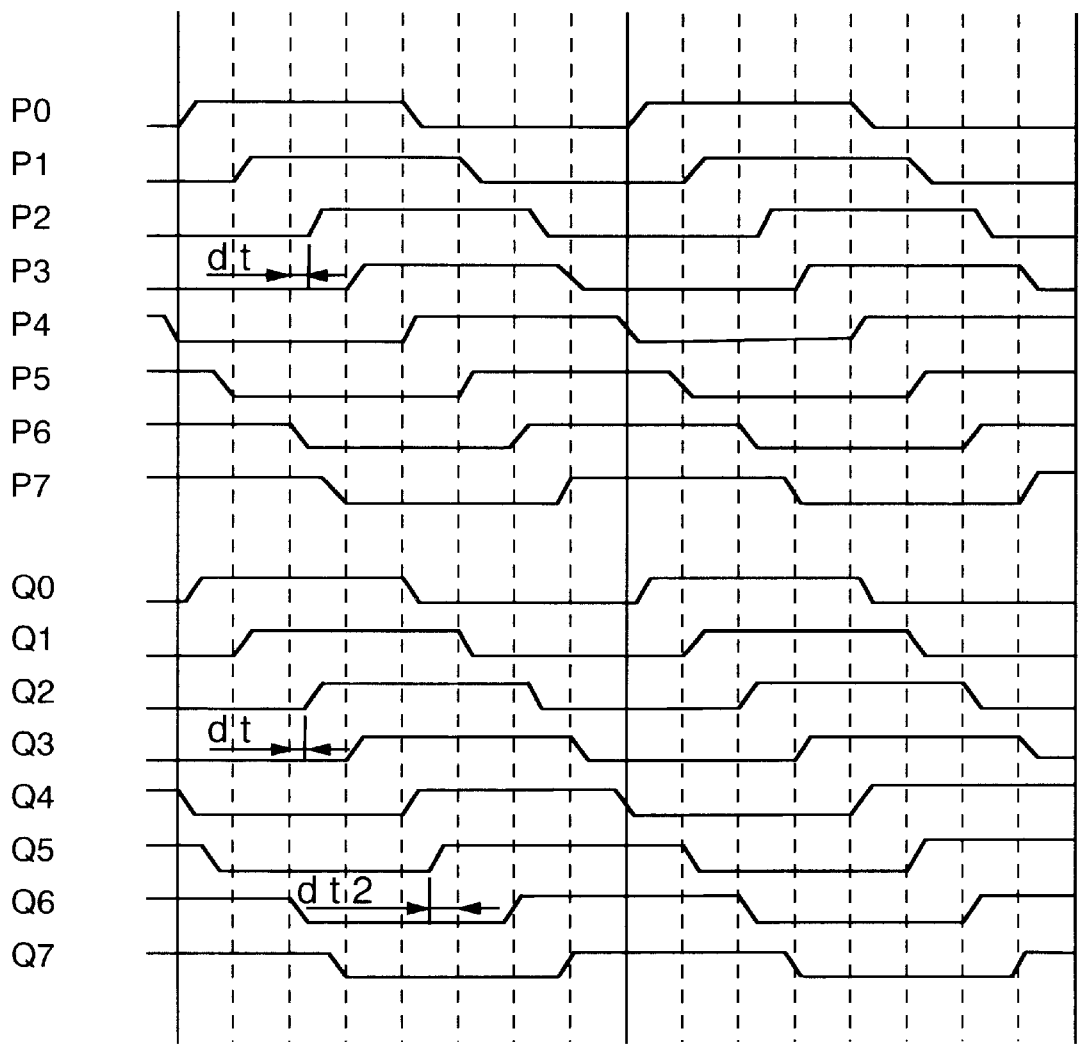
Figure 18:
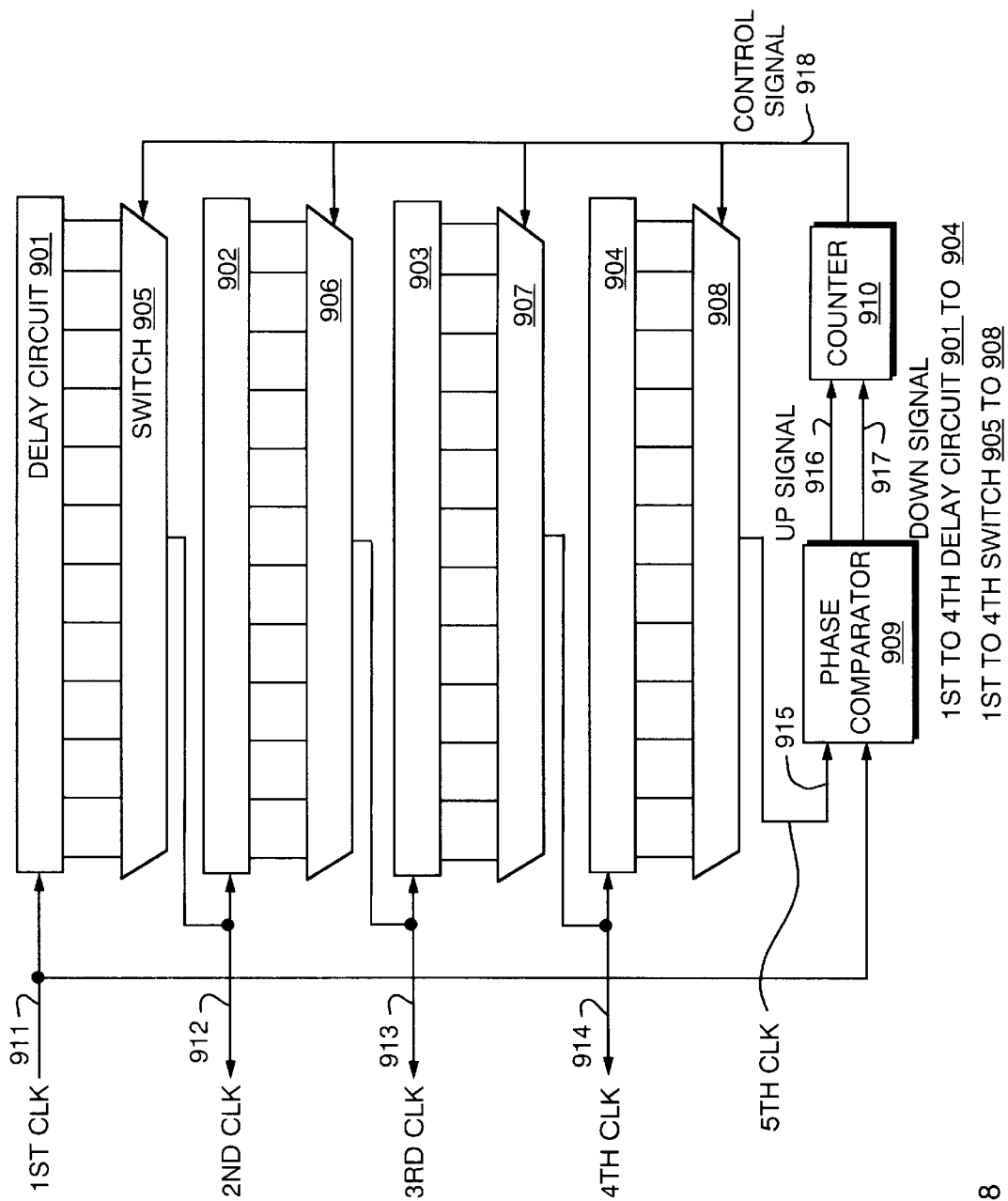
FIG. 18 is a block diagram showing a conventional technique.
Figure 19:
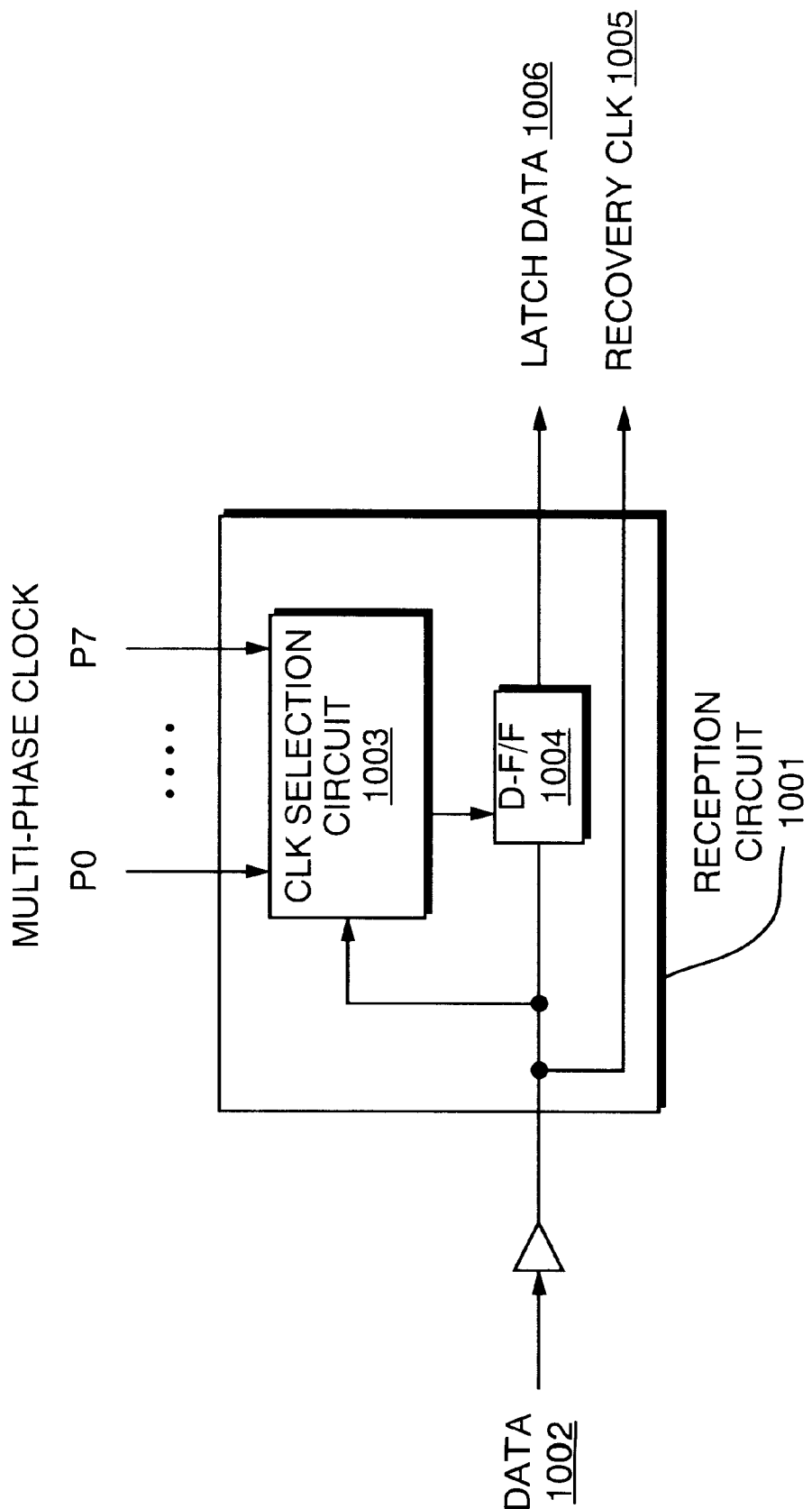
FIG. 19 is a block diagram showing a conventional reception circuit.
Figure 20:
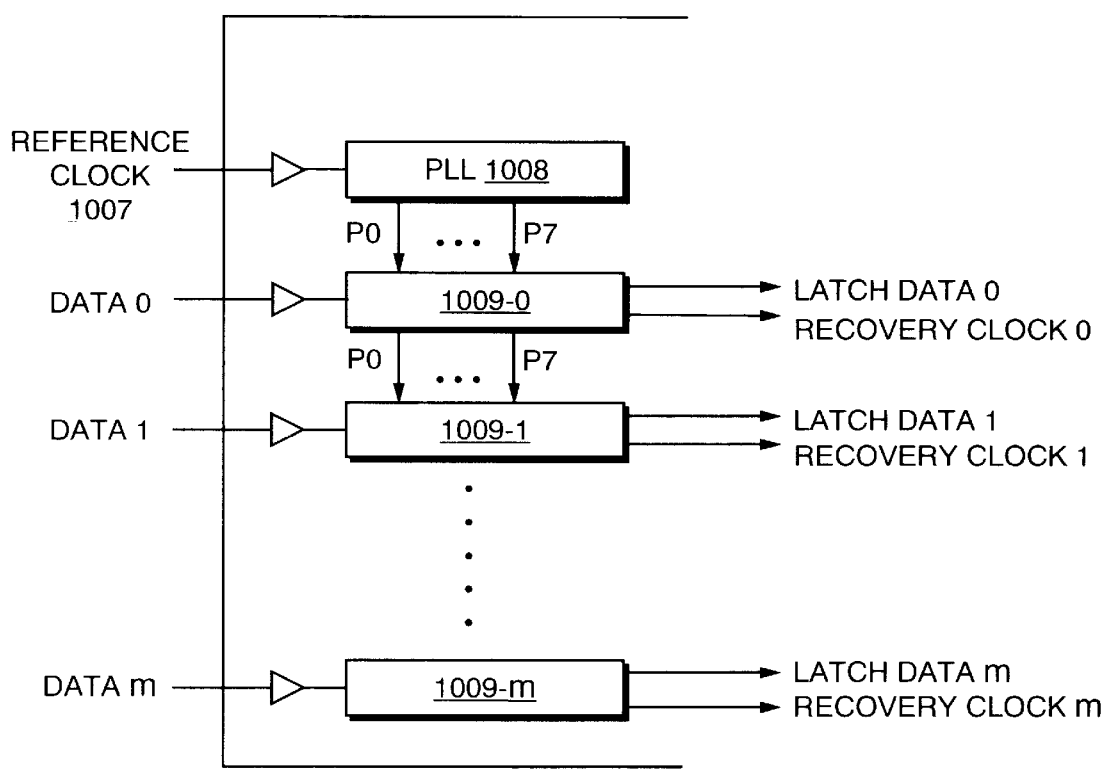
FIG. 20 is a block diagram showing a conventional reception circuit.
Figure 22A:
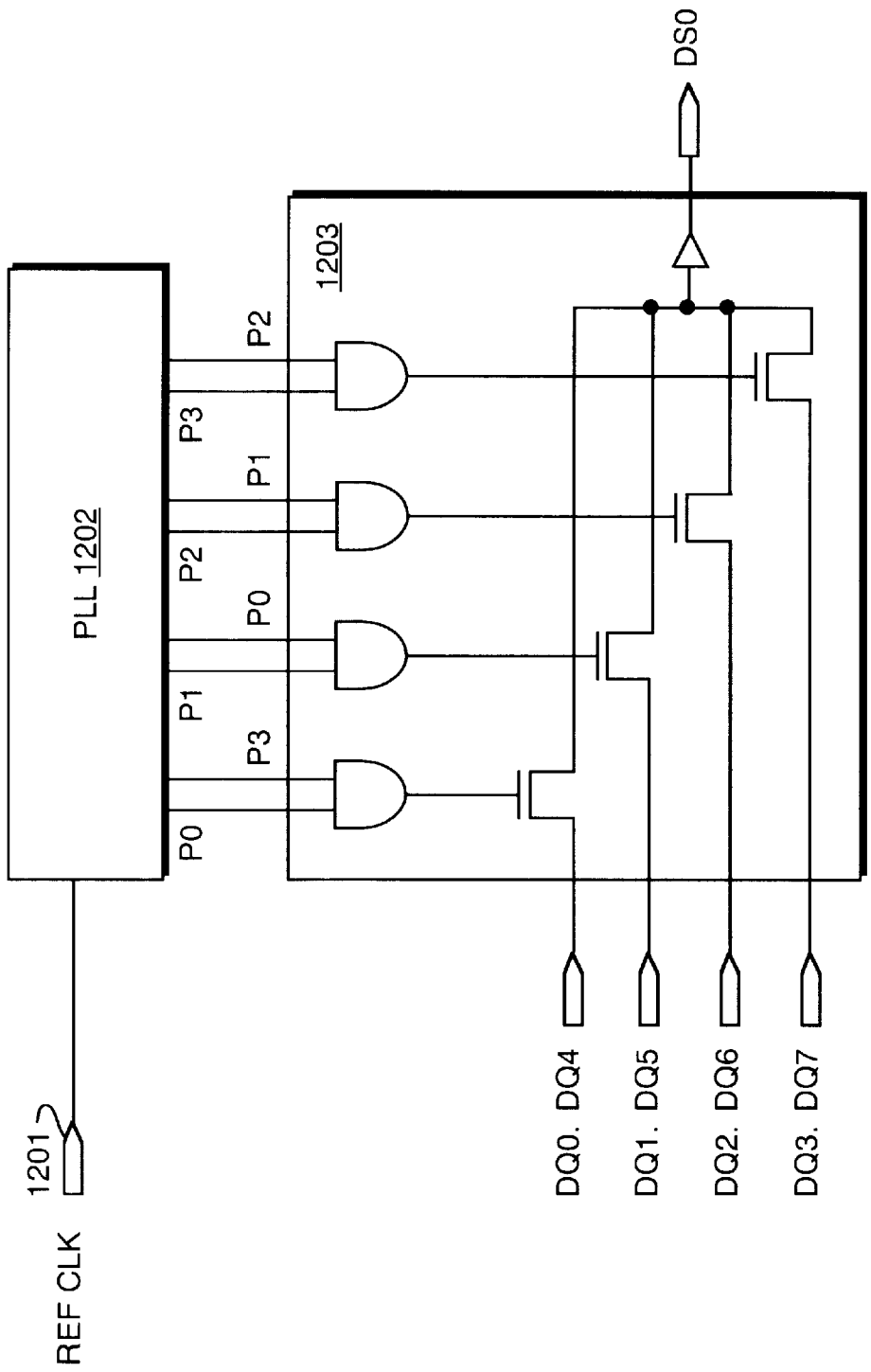
FIGS. 22a, 22b are a detailed block diagram of a conventional transmission circuit and a timing chart therefor, respectively.
Figure 22B:
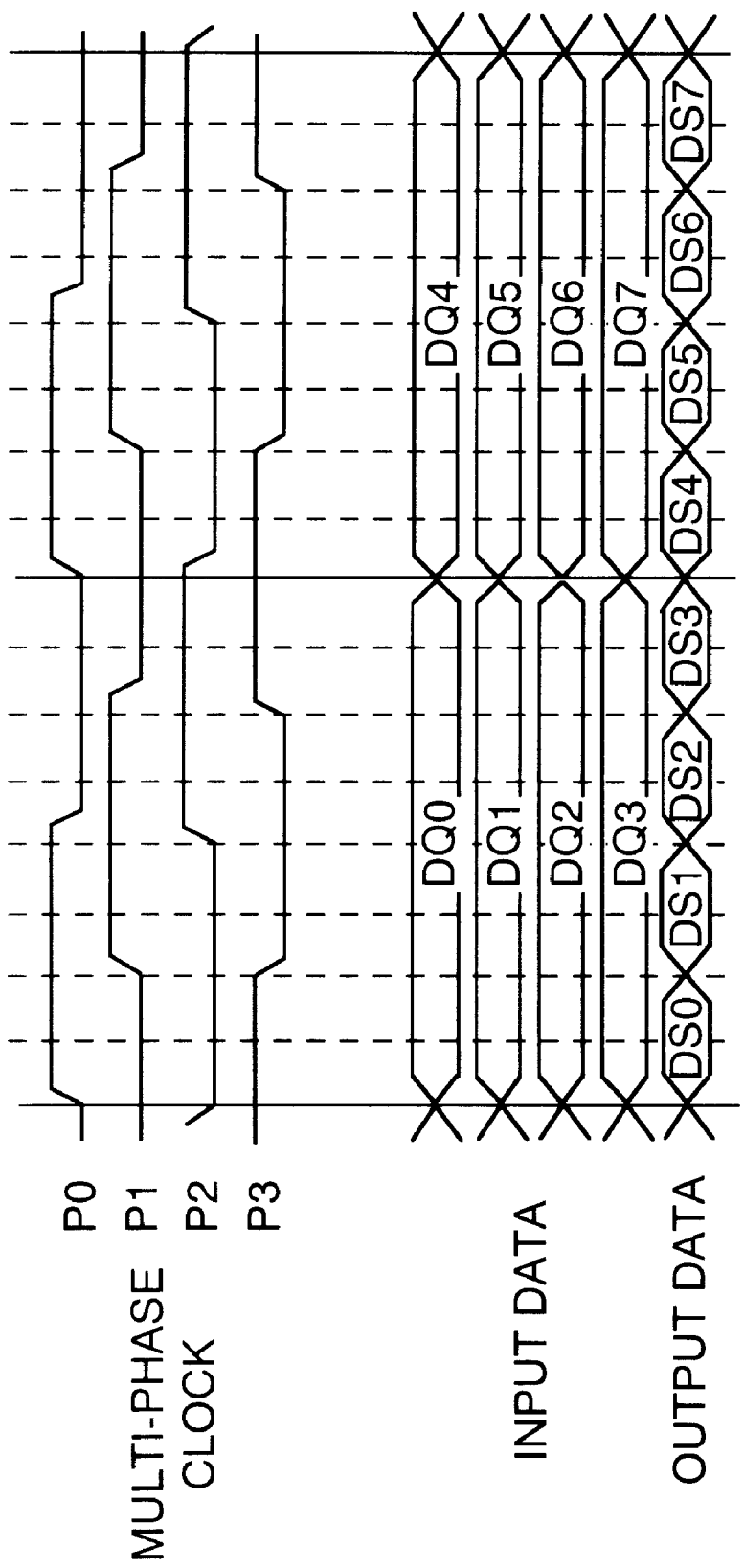

In the present sixth specified example, the present invention is applied to a circuit of FIG. 22 in which parallel data are sequentially output with multi-phase clocks as serial data. FIG. 16 shows a block diagram of the present specified example.

There is provided a plurality of arrangements in which phase error averaging circuits 1404, 1414 and 1424 of the four-phase clock configuration according to the present invention replace PLLs of FIG. 22, whilst a PLL 1402 adapted for generating multi-phase clocks is arranged to supply the multi-phase clocks to the respective phase error averaging circuits. By this configuration, plural transmission circuits can be control led by a single PLL with a reduced phase-to-phase errors.

Thus, the data transmission apparatus of the sixth specified example is constructed so that multi-phase clocks generated in a multi-phase generating circuit are routed to a first device having phase error averaging circuit for averaging out phase errors of the multi-phase clocks as respective phases of the multi-phase clocks are kept, and so that multi-phase clocks generated in the multi-phase generating circuit are routed to a second device having another phase error averaging circuit for averaging out phase errors of the multi-phase clocks as respective phases of the multi-phase clocks are kept.

The meritorious effects of the present invention are summarized as follows.

In the clock signal control circuit according to the present invention, as described above, clock phase interval deviation produced due to manufacturing fluctuations of clock drivers or fluctuations in the wiring resistance can be corrected in the distribution of multiple phase clocks, it is possible to distribute multi-phase clock signals over a wide range or distance.

Moreover, in the multi-phase clocks, generated by e.g., digital PLL circuits, it is possible to correct deviations in the clock phase intervals produced due to quantization errors of the digital PLL circuits.

In a conventional data transmission device, a multi-phase clock generating circuit, such as a multi-phase PLL circuit, is used. However, by using the above-described clock signal control circuit, it is possible to reduce the number of the multi-phase clock generating circuits to construct the circuit more readily and inexpensively.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock signal control circuit wherein
a plurality of averaging circuits connected to a plurality of multi-phase clock signals, wherein each of said averaging circuits causes at least one of the plurality of multi-phase clock signals to interact to average out respective phase error components of said clock signals as the phases of the respective clock signals are kept.

2. A clock signal control circuit
comprising a plurality of averaging circuits,
each of said averaging circuits causing multi-phase clock signals to interact to average out respective phase error components of said clock signals as the phases of the respective clock signals are kept,
said averaging circuits being grouped into a plurality of sets of averaging circuits,
wherein each of said averaging circuit sets effects averaging in a different state from one another.

3. A clock signal control circuit in which phase errors of n pulses having different phase errors are averaged out to produce n pulses having averaged phase errors;
wherein
two or more gates arranged in parallel are provided and outputs of said gates are interconnected to form a unit averaging circuit for averaging phase errors of two or more pulses input to said gates;
n of said unit averaging circuits are provided to constitute an averaging circuit set for averaging phase errors of said n pulses;
$\log_2 n$ stages of said averaging circuit sets are provided;
there being a phase inverting circuit provided at an input of each averaging circuit of a first one of said averaging circuit sets fed with said n pulses.

4. The clock signal control circuit as defined in claim 3 wherein
in the respective unit averaging circuits of at least one of said averaging circuit sets, signals with phases differing by $\pi$ radians are averaged out.

5. The clock signal control circuit as defined in claim 3 wherein
each unit averaging circuit of at least one of said averaging circuit sets averages out signals having phases different by $\pi/2$ radians from one another.

6. The clock signal control circuit as defined in claim 3 wherein
each unit averaging circuit of at least one of said averaging circuit sets averages out signals having phases adjacent to one another.

7. A clock signal control circuit in which phase errors of n pulses having different phase errors are averaged out to produce n pulses having averaged phase errors; wherein
two or more gates arranged in parallel are provided and outputs of said gates are interconnected to form a unit averaging circuit for averaging phase errors of two or more pulses input to said gates;
n of said unit averaging circuits are provided to constitute an averaging circuit set for averaging phase errors of said n pulses;
$\log_2 n$ stages of said averaging circuit sets are provided;
there being a phase inverting circuit provided at an input of each averaging circuit of a first one of said averaging circuit sets fed with said n pulses;

wherein said n pulses are supplied to two different unit averaging circuits of the first averaging circuit set; and wherein outputs of said unit averaging circuits of said first averaging circuit set are each fed to two different unit averaging circuits of a second averaging circuit set provided downstream of said first averaging circuit set.

8. The clock signal control circuit as defined in claim 7 wherein outputs of said unit averaging circuits of the averaging circuit set of a previous stage are respectively fed to two different unit averaging circuits of the averaging circuit set provided downstream of said averaging circuit set of the previous stage.

9. A clock signal control circuit in which phase errors of n pulses having different phase errors are averaged out to produce n pulses having averaged phase errors; wherein two or more gates arranged in parallel are provided and outputs of said gates are interconnected to form a unit averaging circuit for averaging phase errors of two or more pulses input to said gates;

n of said unit averaging circuits are provided to constitute an averaging circuit set for averaging phase errors of said n pulses;

$\log_2 n$ stages of said averaging circuit sets are provided;

there being a phase inverting circuit provided at an input of each averaging circuit of a first one of said averaging circuit sets fed with said n pulses;

wherein in each of the unit averaging circuits of at least one averaging circuit set in said plural averaging circuit sets, signals differing in phase by $\pi/2^k$ radians, where k=0, 1, 2, . . . are averaged out.

10. The clock signal control circuit as defined in claim 9 wherein values of said k in the respective averaging circuit sets are different from one averaging circuit set to another.

11. A clock signal control circuit in which phase errors of n pulses having different phase errors are averaged out to produce n pulses having averaged phase errors;

wherein a unit averaging circuit is formed which comprises a first differential pair, a load of each transistor of said first differential pair and a second differential pair connected in parallel with said first differential pair, each of said first and second differential pairs being fed with pulse signals having phases different from each other by $\pi$ radians to average out the phase errors of four impulses input to said first and second differential pairs, n/2 of said unit averaging circuits being provided to constitute an averaging circuit set for averaging out the phase errors of said n pulses, and wherein there are provided $\log_2$ (n/2) stages of said averaging circuit sets.

12. The clock signal control circuit as defined in claim 11 wherein said n pulses are fed to two different unit averaging circuits of a first one of said unit averaging circuits, and wherein outputs of respective unit averaging circuits of said first averaging circuit set are each fed to two different unit averaging circuits of a second one of said unit averaging circuits provided downstream of said first averaging circuit set.

13. The clock signal control circuit as defined in claim 12 wherein outputs of respective unit averaging circuits of said upstream side averaging circuit set are each fed to different two of said unit averaging circuits provided downstream of said upstream side averaging circuit sets.

14. A clock signal control circuit in which phase errors of n pulses having different phase errors are averaged out to produce n pulses having averaged phase errors;

wherein a plurality of gates connected in parallel with one another are provided, outputs of said plural gates are interconnected to constitute a first unit averaging circuit adapted for averaging out phase errors of two or more pulses input to said gates, and a plurality of said first unit averaging circuits are provided to constitute a first averaging circuit set; and wherein a second unit averaging circuit is formed which comprises a first differential pair, a load of each transistor of said first differential pair and a second differential pair connected in parallel with said first differential pair, each of said first and second differential pairs being fed with pulse signals having phases different from each other by $\pi$ radians to average out phase errors of four pulses fed to said first and second differential pairs, there being provided n/2 second unit averaging circuits to constitute a second averaging circuit set;

respective outputs of the unit averaging circuits of said first averaging circuit set being fed to the unit averaging circuit of said second averaging circuit set.

15. A clock signal control circuit in which phase errors of n pulses having different phase errors are averaged out to produce n pulses having averaged phase errors;

wherein a first unit averaging circuit is formed which comprises a first differential pair, a load of each transistor of said first differential pair and a second differential pair connected in parallel with said first differential pair, each of said first and second differential pairs being fed with pulse signals having phases different from each other by $\pi$ radians to average out the phase errors of four impulses fed to said first and second differential pairs, n/2 of said unit averaging circuits being provided to constitute an averaging circuit set for averaging out the phase errors of four pulses fed to said first and second differential pairs to constitute a first averaging circuit set;

a second unit averaging circuit is formed which comprises a plurality of gates arranged in parallel with one another, outputs of said plural gates being interconnected to average out phase errors of two or more pulses fed to said gates, a plurality of said second unit averaging circuits being provided to constitute a second averaging circuit set;

respective outputs of said unit averaging circuits of said first averaging circuit set being adapted to be fed to said unit averaging circuits of said second averaging circuit set.

16. A data transmission apparatus wherein multi-phase clocks generated in a multi-phase generating circuit are fed to a first device having phase error averaging circuit to average out phase errors of said multi-phase clocks as respective phases of said multi-phase clocks are kept, and wherein output of said phase error averaging circuit of said first device being fed to a second device having another phase error averaging circuit to average out phase errors of said multi-phase clocks under the condition that respective phases of said multi-phase clocks fed to said second device are kept.

17. The data transmission apparatus as defined in claim 16 wherein said phase error averaging circuit is provided in a transmission device of a data transmission apparatus.

18. The data transmission apparatus as defined in claim 16 wherein said phase error averaging circuit is provided in a reception device of a data transmission apparatus.

19. A data transmission apparatus wherein multi-phase clocks generated in a multi-phase generating circuit are fed to a first device having phase error averaging circuit to average out phase errors of said multi-phase clocks under the condition that respective phases of said multi-phase clocks are kept, and wherein multi-phase clocks generated in said multi-phase generating circuit are fed to a second device having another phase error averaging circuit to average out phase errors of said multi-phase clocks under the condition that respective phases of said multi-phase clocks are kept.

20. A method for controlling clock signals comprising:

providing multi-phase clock signals having phase errors, and causing said multi-phase clock signals to interact with one another to average out phase error components of said lock signals, with the phases of said clock signals being kept.

* * * * *